US009225147B2

(12) United States Patent
Hayakawa et al.

(10) Patent No.: US 9,225,147 B2
(45) Date of Patent: Dec. 29, 2015

(54) OPTICAL SEMICONDUCTOR DEVICE AND METHOD OF MANUFACTURING THE SAME

(71) Applicant: FUJITSU LIMITED, Kawasaki-shi, Kanagawa (JP)

(72) Inventors: Akinori Hayakawa, Sagamihara (JP); Takeshi Matsumoto, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/944,520

(22) Filed: Jul. 17, 2013

(65) Prior Publication Data

US 2014/0036948 A1 Feb. 6, 2014

(30) Foreign Application Priority Data

Jul. 31, 2012 (JP) ................. 2012-170114

(51) Int. Cl.
*H01S 5/343* (2006.01)
*H01S 5/0625* (2006.01)
*H01S 5/12* (2006.01)
*H01S 5/16* (2006.01)
*H01S 5/223* (2006.01)
*H01S 5/028* (2006.01)

(52) U.S. Cl.
CPC ............ *H01S 5/343* (2013.01); *H01S 5/06258* (2013.01); *H01S 5/12* (2013.01); *H01S 5/1218* (2013.01); *H01S 5/164* (2013.01); *H01S 5/2231* (2013.01); *H01S 5/0287* (2013.01); *H01S 5/1203* (2013.01); *H01S 2301/163* (2013.01)

(58) Field of Classification Search
CPC ..... H01S 5/0287; H01S 5/06258; H01S 5/12; H01S 5/163; H01S 5/164; H01S 5/1203; H01S 5/1218; H01S 5/2218; H01S 5/2231; H01S 5/343; H01S 2301/163

USPC ........................................................ 372/45.01
See application file for complete search history.

(56) References Cited

U.S. PATENT DOCUMENTS 4,633,474 A * 12/1986 Akiba et al. .................. 372/19
5,666,455 A * 9/1997 Aoki et al. ................... 385/131
(Continued)

FOREIGN PATENT DOCUMENTS

JP 09-023037 1/1997
JP 2001-094207 4/2001
(Continued)

OTHER PUBLICATIONS

CNOA—Office Action dated Jul. 20, 2015 issued with respect to the corresponding Chinese Patent Application No. 201310328802.0, with full English translation.

*Primary Examiner* — Xinning Niu
(74) *Attorney, Agent, or Firm* — Fujitsu Patent Center

(57) ABSTRACT

An optical semiconductor device includes a semiconductor substrate; a lower cladding layer formed over the semiconductor substrate; a quantum well active layer formed on the lower cladding layer; a diffraction grating layer formed over the quantum well active layer and having diffraction gratings formed in a surface thereof; and an upper cladding layer formed on the diffraction gratings of the diffraction grating layer. Further, a band gap in outer regions of the quantum well active layer that are adjacent to outer end surfaces of the optical semiconductor device is greater than the band gap in an inner region of the quantum well active layer that is located between the outer regions, and a thickness of one or more layers, which include the lower cladding layer and positioned between the semiconductor substrate and the quantum well active layer, is greater than or equal to 2.3 μm.

25 Claims, 20 Drawing Sheets

(56) References Cited

U.S. PATENT DOCUMENTS

| | | | |
|---|---|---|---|
| 5,844,931 A * | 12/1998 | Sagawa et al. | 372/45.01 |
| 2005/0006654 A1* | 1/2005 | Kang et al. | 257/80 |
| 2010/0105158 A1* | 4/2010 | Yamada | 438/31 |

FOREIGN PATENT DOCUMENTS

| | | |
|---|---|---|
| JP | 2001-230491 | 8/2001 |
| WO | 2005057744 | 6/2005 |

* cited by examiner

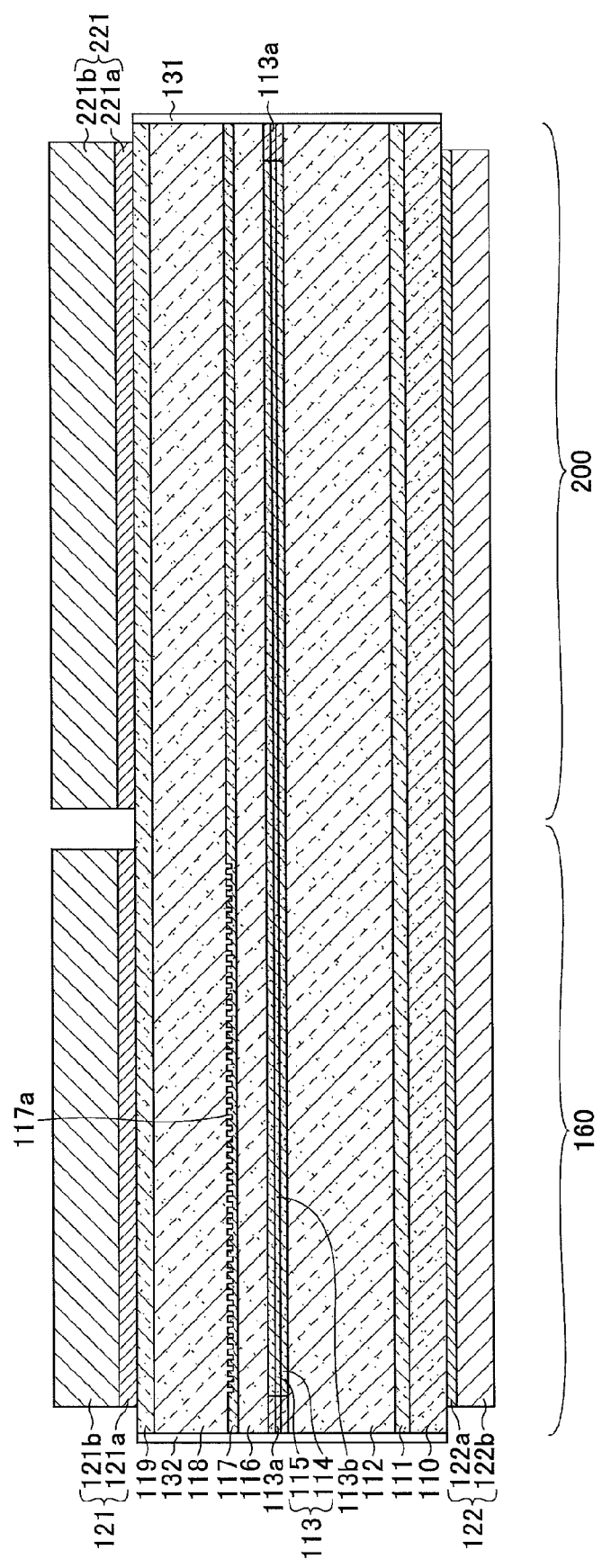

OPTICAL SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-170114, filed on Jul. 31, 2012, the entire contents of which are incorporated herein by reference.

FIELD

The embodiment discussed herein is related to an optical semiconductor device and a method of manufacturing the optical semiconductor device.

BACKGROUND

Semiconductor lasers, which are optical semiconductor devices, have been widely used in various wavelength ranges. Among those semiconductor lasers, Distributed Feed-Back (DFB) lasers and Distributed Bragg Reflector (DBR) lasers have been used in communication applications and also used as a light source of an imaging device requiring a monochromatic laser. This is because those DFB and DBR lasers may lase in a single longitudinal mode.

Moreover, reliability and service lifetime of a semiconductor laser are main factors to be considered when the semiconductor laser is put into practical use. In this regard, optical damage (which may be called Catastrophic Optical Damage (COD)) to an end surface of the semiconductor device may often become a major determinant factor for the service lifetime of the semiconductor lasers.

Further, in a case where the maximum output and the like of the semiconductor laser is likely to be limited due to the COD thereof, if it is desired for the semiconductor device to output high power, it may be desired that the COD is controlled (reduced).

Reference may be made to Japanese Laid-open Patent Publication Nos. 2001-230491, 2001-94207, and H09-23037.

SUMMARY

According to an aspect of the present invention, an optical semiconductor device includes a semiconductor substrate; a lower cladding layer formed over the semiconductor substrate and formed of a semiconductor material; a quantum well active layer formed on the lower cladding layer and formed of a semiconductor material; a diffraction grating layer formed over the quantum well active layer and formed of a semiconductor material, the diffraction grating layer having diffraction gratings formed in a surface thereof; and an upper cladding layer formed on the diffraction gratings of the diffraction grating layer.

Further, a band gap in outer regions of the quantum well active layer that are adjacent to outer end surfaces of the optical semiconductor device is greater than a band gap in an inner region of the quantum well active layer that is located between the outer regions.

Further, a thickness of one or more layers, which include the lower cladding layer and positioned between the semiconductor substrate and the quantum well active layer, is greater than or equal to 2.3 μm.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 21 is a cut-away side view of the optical semiconductor device according to the second embodiment.

DESCRIPTION OF EMBODIMENT

Figure 1:
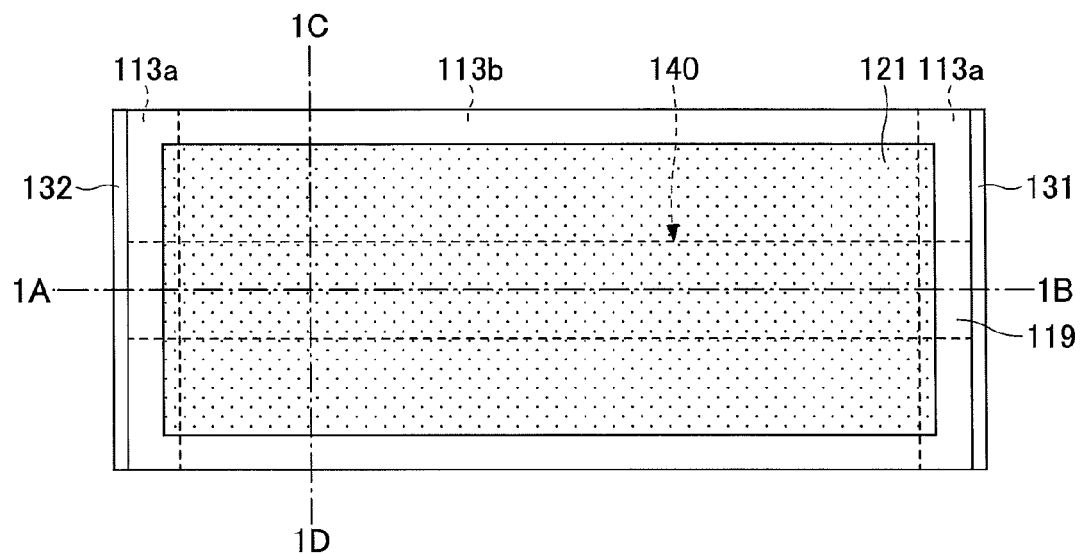
FIG. 1 is a top view of an optical semiconductor device according to a first embodiment.

The COD of a semiconductor device may occur when laser light output from a semiconductor laser is absorbed by a defect or a non-radiative center, that is caused by a surface level, a region near an end surface of the semiconductor device is thereby locally heated, a band gap is reduced due to the resulting temperature increase, and the absorption of the laser light is further increased to cause the temperature near the end surface to eventually reach the melting temperature.

Therefore, to prevent the occurrence of the COD, it is thought to be effective to employ a so-called window structure in which a band gap in a quantum well active layer near end surfaces is selectively widened. Such selectively widening the band gap may be achieved by "widening the band gap in the quantum well active layer or a quantum well layer near the end surfaces based on impurity diffusion or vacancy diffusion by heating".

To prevent the COD, it is desired to widen the band gap in a quantum well active layer in the regions near the end surfaces which become the window regions of the window structure. However, in this case, the band gap in the quantum well active layer in a region other than the regions near the end surfaces may be widened as well. Namely, a band-gap shift may occur in which the band gap in the quantum well active layer is also widened in a region other than the window regions (i.e., the regions other than the regions near the end surfaces).

Such band-gap shift in the active region as described above may significantly affect the single-longitudinal-mode laser such as the DFB laser and the DBR laser where the oscillation wavelength is determined based on diffraction gratings.

The output characteristics and the temperature characteristics of such a single-longitudinal-mode laser may be strongly affected by a difference called "detuning" indicating a difference between the Bragg wavelength determined by the diffraction gratings and the gain peak wavelength determined by band gap. The Bragg wavelength is strictly determined based on the application of the laser to be used. Therefore, the band gap shift in the quantum well active layer in the region other than the window regions means the change of the detuning.

Therefore, when forming the window structure in the DFB laser or the DBR laser, it may be important to pay attention not only to increasing the band gap in the emission end surfaces which become the window regions but also to preventing the increase of the band gap in the region other than the window regions (i.e. it is important to control the band gap in the region inside the window regions in the quantum well active layer).

Therefore, it is desired to provide an optical semiconductor device including a single-longitudinal-mode laser having diffraction gratings and a method of manufacturing such an optical semiconductor device where the band gap in an outer region of the quantum well active layer adjacent to the laser output surface is greater (wider) than the band gap in an inner region that is adjacent to the outer region and includes the center part of the quantum well active layer, and where the band gap in the inner region does not significantly vary among lots and wafers. Namely, it is desired to provide optical semiconductor devices whose variance of the band gap in the quantum well active layer is small.

In the following, embodiments to carry out the present invention are described. In the descriptions and figures, the same reference numerals are used to describe the same or equivalent elements and repeated descriptions thereof may be omitted.

First Embodiment

Optical Semiconductor Device

An optical semiconductor device according to a first embodiment is described.

Figure 2:
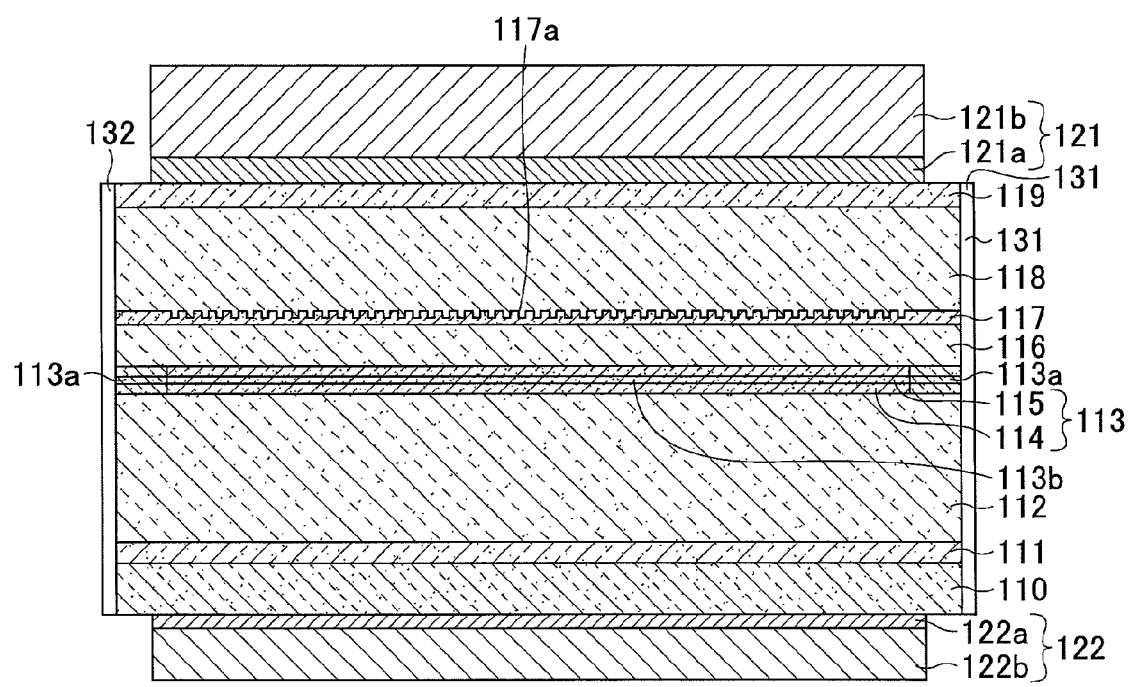
FIG. 2 is a first cut-away side view of the optical semiconductor device according to the first embodiment.
Figure 3:
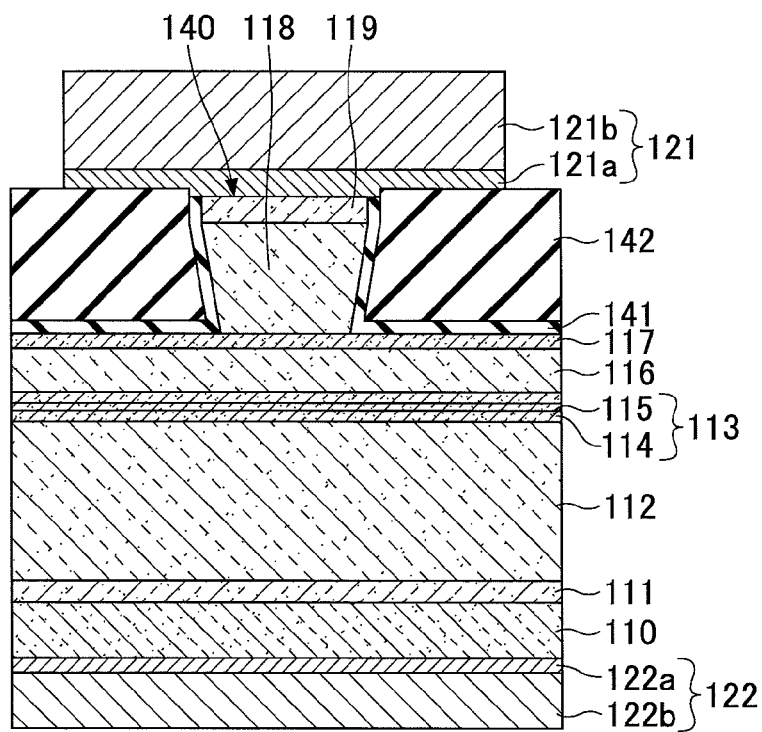
FIG. 3 is a second cut-away side view of the optical semiconductor device according to the first embodiment.

FIG. 1 is a top view of an optical semiconductor device according to this embodiment. FIG. 2 is a cut-away side view of the optical semiconductor device when cut along the dashed-dotted line 1A-1B of FIG. 1. Further, FIG. 3 is a cut-away side view when cut along the dashed-dotted line 1C-1D of FIG. 1. For explanatory purposes, FIGS. 2 and 3 schematically illustrate states of the corresponding cross-sections.

As an optical semiconductor device according to this embodiment, a so-called DFB (Distributed Feed-Back) laser is described.

As illustrated in the figures, the optical semiconductor device according to this embodiment includes a buffer layer 111, a first cladding layer 112, a quantum well active layer 113, a second cladding layer 116, a diffraction grating layer 117, a third cladding layer 118, and a contact layer 119, which are laminated and formed on a semiconductor substrate 110.

As the semiconductor substrate 110, an n-GaAs substrates is used. The buffer layer 111 is formed of an n-GaAs layer. The first cladding layer 112 is formed of an n-AlGaAs layer.

The quantum well active layer 113 is formed of a barrier layer 114 and a quantum well layer 115 in a manner such that the barrier layer 114 and the quantum well layer 115 are alternately laminated on each other. Here, the barrier layer 114 is formed of an i-GaAs layer, and the quantum well layer 115 is formed of an i-InGaAs layer. By doing this, the quantum well active layer 113 may have a Multi Quantum Well (MQW) structure.

The second cladding layer 116 is formed of a p-AlGaAs layer. The diffraction grating layer 117 is made of p-GaAs. Further, on a surface of the diffraction grating layer 117, diffraction gratings 117a are formed based on a predetermined cycle. The third cladding layer 118 is formed of a p-InGaP layer. The contact layer 119 is formed of a p-GaAs layer.

In this embodiment, the first cladding layer 112 may be referred to as a lower cladding layer, and the third cladding layer 118 may be referred to as an upper cladding layer. Further, in this embodiment, a case is described where the second cladding layer 116 is formed. However, it should be noted that the second cladding layer 116 may not be formed.

Further, by etching a part of the third cladding layer 118 and the contact layer 119, a ridge waveguide 140 is formed. Further, a protection film 141 is formed on a side surface of the ridge waveguide 140 and on a surface of a region removed by the etching. Further, a buried layer 142 is formed so as to bury the region removed by the etching.

Further, an upper electrode 121, which is in contact with the contact layer 119, is formed on the contact layer 119. Also, a lower electrode 122 is formed on the rear side of the semiconductor substrate 110. Specifically, the upper electrode 121 includes a metal film 121a and a coating layer (film) 121b, and the upper electrode 121 is formed in a manner that the metal film 121a and the coating layer 121b are sequentially laminated on the contact layer 119.

Similarly, the lower electrode 122 includes a metal film 122a and a coating layer 122b, and the lower electrode 122 is formed in a manner that the metal film 122a and the coating layer 122b are sequentially laminated on the rear surface (side) of the semiconductor substrate 110.

Further, an anti-reflection film 131 is formed on an (outer) end surface of the DFB laser (i.e., on an end surface on a side where laser light is emitted). Further, a high-reflection film 132 is formed on an end surface opposite to the end surface (side) where the anti-reflection film 131 is formed.

Each of the anti-reflection film 131 and the high-reflection film 132 may be formed of a dielectric multi-layer in a manner such that dielectric materials having different refractive indices and predetermined thicknesses are alternately laminated on each other so as to obtain corresponding desired characteristics.

Further, the quantum well active layer 113 is formed in a manner that a band gap in a region 113a near the high-reflection film 132 and a region 113a near the anti-reflection film 131 (i.e., a region near an end surface of the DFB laser) is wider than that of an inner region 113b which is formed inner side of the regions 113a near the (outer) end surfaces of the DFB laser (i.e., the region 113a near the high-reflection film 132 and the region 113a near the anti-reflection film 131).

Hereinafter, the regions 113a near the end surfaces of the DFB laser may be called a "window part". Therefore, the region other than the "window part" is the inner region 113b.

Further, in this embodiment, the optical semiconductor device is formed in a manner that a thickness between the surface of the semiconductor substrate 110 and the boundary of the quantum well active layer 113 (i.e., a thickness corresponding to a sum of the thicknesses of the buffer layer 111 and the first cladding layer 112) is greater than or equal to 2.3 µm.

Method of Manufacturing Optical Semiconductor Device

Next, a method of manufacturing the optical semiconductor device according to this embodiment is described with reference to FIGS. 4 through 19. For explanatory purposes, FIGS. 4A through 7B and 10A through 19B schematically illustrate states of the corresponding cross-sections.

Figure 4A:
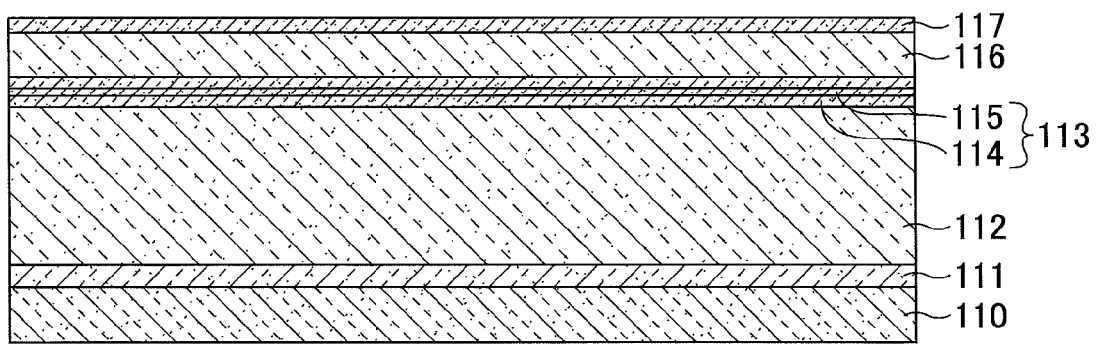
FIGS. 4A and 4B are first cut-away side views when the optical semiconductor device according to the first embodiment is manufactured.
Figure 4B:
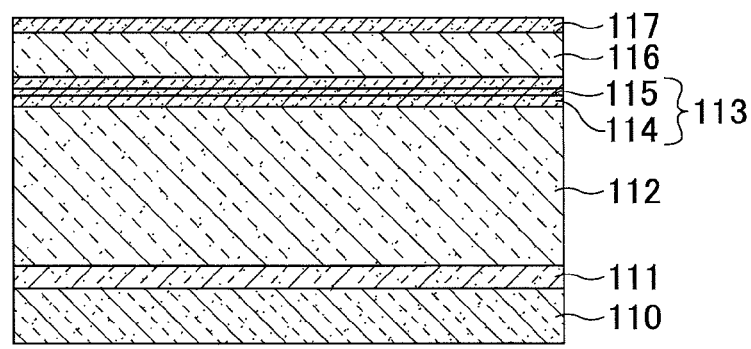

First, as illustrated in FIGS. 4A and 4B, the buffer layer 111, the first cladding layer 112, the quantum well active layer 113, the second cladding layer 116, and the diffraction grating layer 117 are formed on the n-GaAs substrate, which is the semiconductor substrate 110 by epitaxial growth.

Specifically, by using epitaxial growth technique of Molecular Beam Epitaxy (MBE), the buffer layer 111, the first cladding layer 112, the quantum well active layer 113, the second cladding layer 116, and the diffraction grating layer 117 are formed on the semiconductor substrate 110. In this embodiment, as is described above, the first cladding layer 112 may be referred to as the lower cladding layer.

Further, FIGS. 4A and 4B are cut-away side views schematically illustrating this process. Specifically, FIG. 4A is a cut-away side view when cut along the dashed-dotted line 1A-1B of FIG. 1, and FIG. 4B is a cut-away side view when cut along the dashed-dotted line 1C-1D of FIG. 1.

The buffer layer 111 is formed of an n-GaAs layer having a thickness of approximately 300 nm. Further, as an impurity element, Si is doped with approximately $1 \times 10^{+18}$ cm$^{-3}$.

The first cladding layer 112 is formed of an n-AlGaAs layer having a thickness of approximately 4,000 nm. Further, as an impurity element, Si is doped with approximately $5 \times 10^{+17}$ cm$^{-3}$.

The quantum well active layer 113 is formed in a manner that the barrier layers 114 and the quantum well layers 115 are alternately laminated on each other. The barrier layer 114 is formed of an i-GaAs layer, and the quantum well layer 115 is formed of an i-InGaAs layer.

Specifically, in this embodiment, the quantum well active layer 113 is formed by sequentially laminating the barrier layers 114 having a thickness of approximately 40 nm, the quantum well layers 115 having a thickness of approximately 7 nm, the barrier layers 114 having a thickness of approximately 20 nm, the quantum well layers 115 having a thickness of approximately 7 nm, and the barrier layers 114 having a thickness of approximately 40 nm.

In this case, the barrier layers 114 having a thickness of approximately 40 nm, which are formed on both sides (ends) of the quantum well active layer 113, may be called "SCH layers".

The second cladding layer 116 is formed of a p-AlGaAs layer having a thickness of approximately 150 nm. Further, as an impurity element, Be is doped with approximately $2 \times 10^{+17}$ cm$^{-3}$.

The diffraction grating layer 117 is formed of a p-GaAs layer having a thickness of approximately 60 nm. Further, as an impurity element, Be is doped with approximately $5 \times 10^{+17}$ cm$^{-3}$.

Figure 5A:
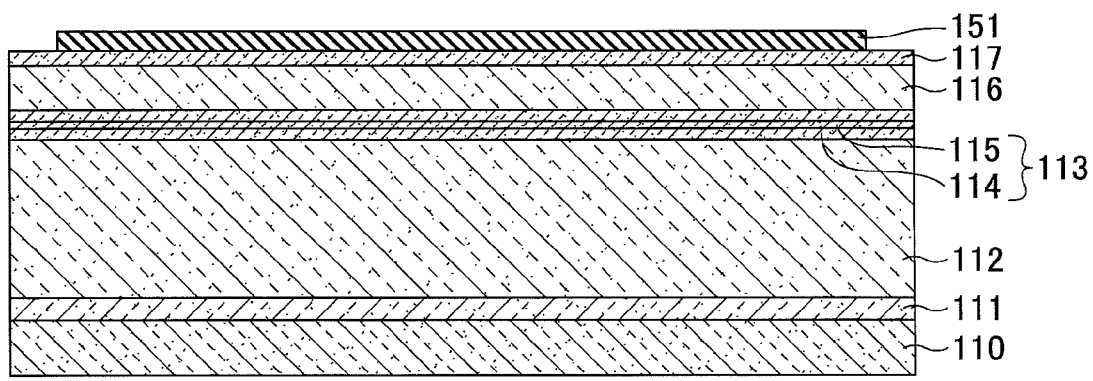
FIGS. 5A and 5B are second cut-away side views when the optical semiconductor device according to the first embodiment is manufactured.
Figure 5B:
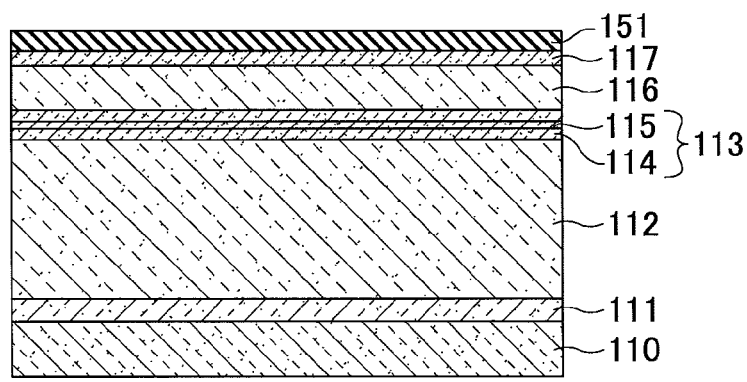

Next, as illustrated in FIGS. 5A and 5B, a silicon nitride layer 151 is formed. Specifically, a SiN film is formed on a surface of the diffraction grating layer 117 by Plasma-enhanced Chemical Vapor Deposition (P-CVD), and then, a photoresist is applied on the formed SiN film.

After that, an exposure process is performed by an exposure device, and a development process is performed. By doing this, a resist pattern (not shown) having openings in regions near the end surfaces of the DFB laser is formed.

Then, the region, which is not covered with the resist pattern, of the SiN film is removed by wet etching using hydrofluoric acid to form the silicon nitride layer 151.

By doing this, the silicon nitride layer 151 is formed on a part corresponding to the inner region 113b including the center part between the end surfaces of the DFB laser, and accordingly is not formed in the regions near the end surfaces of the DFB laser.

Therefore, the diffraction grating layer 117 is disposed in the regions near the end surfaces of the DFB laser. After that, the resist pattern (not shown) is removed with organic solvent or the like. In this embodiment, the silicon nitride layer 151 may be referred to as a "first dielectric layer".

Further, FIGS. 5A and 5B are cut-away side views schematically illustrating this process. Specifically, FIG. 5A is a cut-away side view when cut along the dashed-dotted line 1A-1B of FIG. 1, and FIG. 5B is a cut-away side view when cut along the dashed-dotted line 1C-1D of FIG. 1.

Next, as illustrated in FIG. 6, a silicon oxide layer 152 is formed on the surface where the silicon nitride layer 151 is formed.

Specifically, the silicon oxide layer 152 is formed on a surface where the silicon nitride layer 151 and the diffraction grating layer 117 are disposed by the P-CVD.

By doing this, on the diffraction grating layer 117, the silicon nitride layer 151 and the silicon oxide layer 152 are laminated in this order and formed in the inner region 113b, and elsewhere, the silicon oxide layer 152 is formed in the regions near the end surfaces of the DFB laser. In this embodiment, the silicon oxide layer 152 may be referred to as a "second dielectric layer".

Figure 6A:
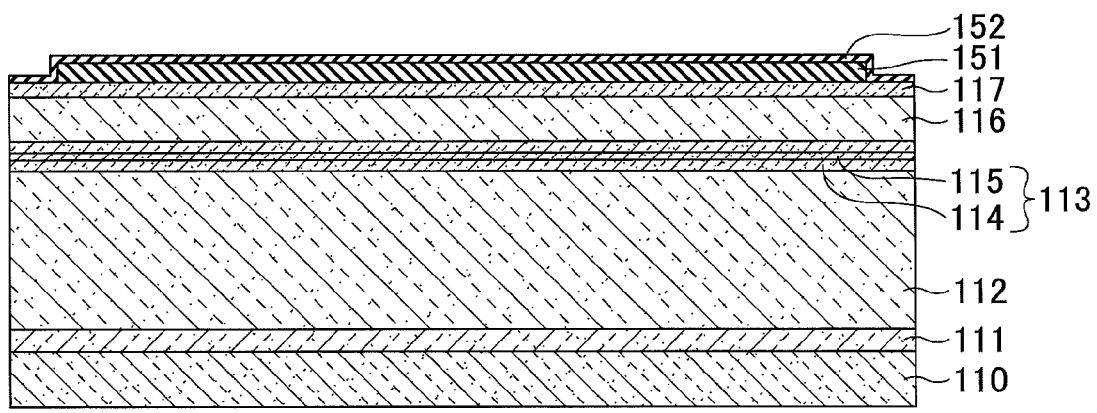
FIGS. 6A and 6B are third cut-away side views when the optical semiconductor device according to the first embodiment is manufactured.
Figure 6B:
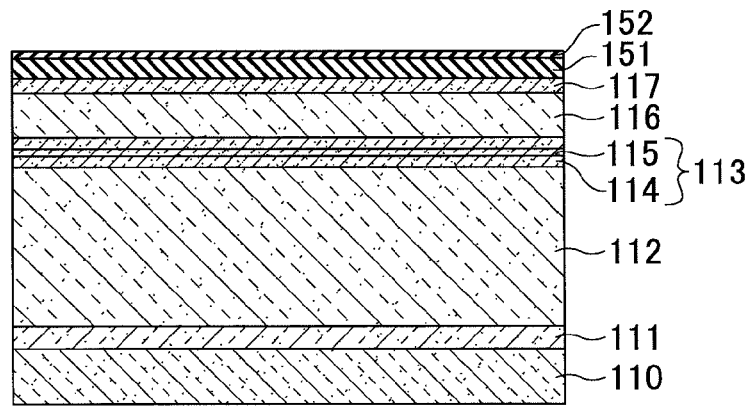

Further, FIGS. 6A and 6B are cut-away side views schematically illustrating this process. Specifically, FIG. 6A is a cut-away side view when cut along the dashed-dotted line 1A-1B of FIG. 1, and FIG. 6B is a cut-away side view when cut along the dashed-dotted line 1C-1D of FIG. 1.

Next, as illustrated in FIG. 7, after a heating process is performed, diffraction gratings 117a are formed on (in) a surface of the diffraction grating layer 117.

Specifically, in this heating process, 890 degree heat is applied for thirty seconds by using a Rapid Thermal Annealing (RTA) apparatus ("fast heating process").

By this heating process, in the regions near the end surfaces of the DFB laser (i.e., in the regions where the silicon oxide layer 152 is formed on the diffraction grating layer 117), holes may be diffused from the silicon oxide layer 152, so that the diffused holes penetrate to the quantum well active layer 113.

Due to the penetration of the holes to the quantum well active layer 113, atomic interdiffusion between the quantum well layer 115 and the barrier layer 114 is more likely to occur in the quantum well active layer 113. Accordingly, the composition in the quantum well layer 115 may change.

Due to this change, the band gap may be widened. Specifically, the band gap in the quantum well layer 115 in the regions 113a near the end surfaces of the DFB laser may be widened. Accordingly, the band gap in the quantum well active layer 113 in the regions 113a near the end surfaces of the DFB laser may also be widened.

On the other hand, in the inner region 113b, the silicon nitride layer 151 may serve as a barrier. Namely, due to the inner region 113b, almost none of the holes may diffuse from the silicon oxide layer 152 to the diffraction grating layer 117 and the second cladding layer 116 even when the heating process is performed. Therefore, almost none of the holes may arrive in the quantum well active layer 113.

Figure 7A:
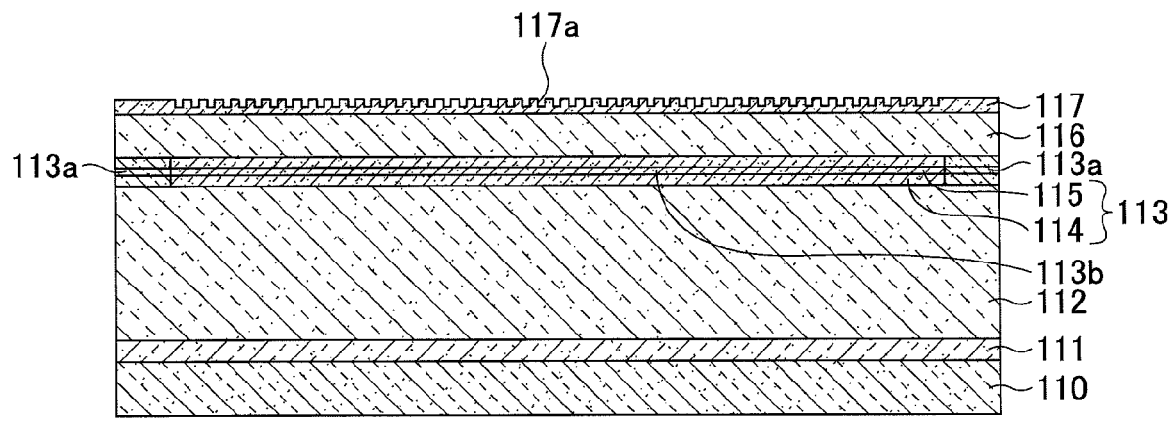
FIGS. 7A and 7B are fourth cut-away side views when the optical semiconductor device according to the first embodiment is manufactured.
Figure 7B:
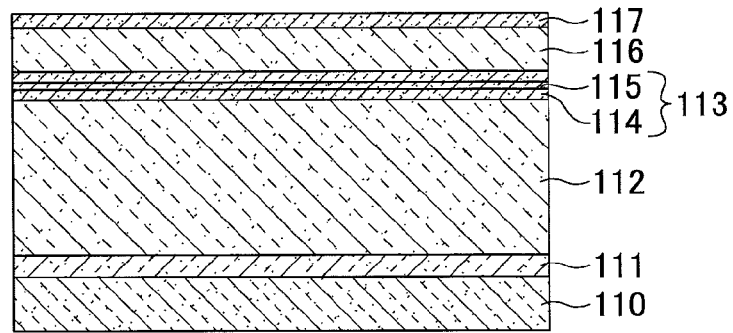

Further, FIGS. 7A and 7B are cut-away side views schematically illustrating this process. Specifically, FIG. 7A is a cut-away side view when cut along the dashed-dotted line 1A-1B of FIG. 1, and FIG. 7B is a cut-away side view when cut along the dashed-dotted line 1C-1D of FIG. 1.

Figure 8:
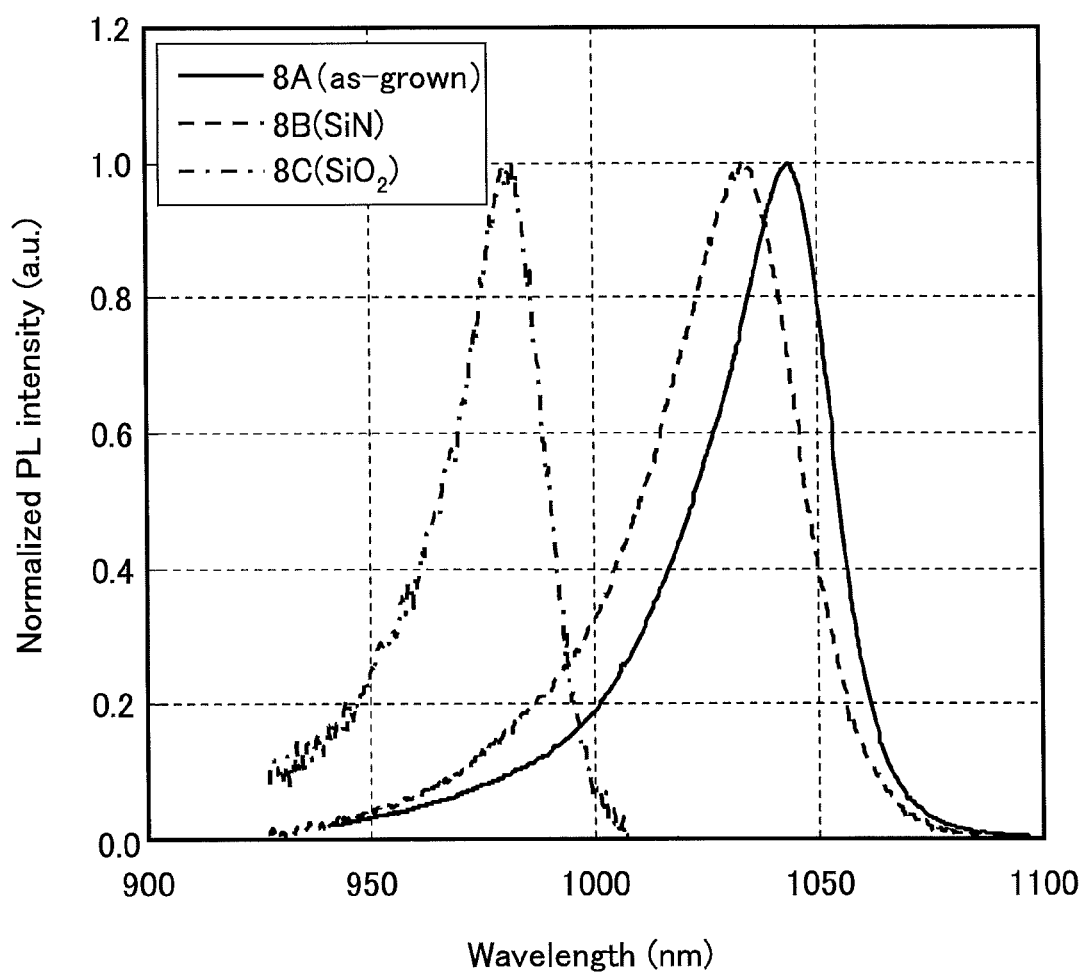
FIG. 8 illustrates PL emission characteristics of a quantum well active layer.

The widening of the band gap is described in more detail with reference to FIG. 8. FIG. 8 illustrates Photoluminescence (PL) emission characteristics in the quantum well active layer 113. The PL intensity characteristics in FIG. 8 are normalized.

In FIG. 8, a line 8A notes the PL intensity characteristics before the fast heating process is performed. A line 8B denotes the PL intensity characteristics after the fast heating process is performed on the region where the silicon nitride layer 151 and the silicon oxide layer 152 are sequentially formed on the diffraction grating layer 117. A line 8C denotes the PL intensity characteristics after the fast heating process is performed on the region where the silicon oxide layer 152 is formed on the diffraction grating layer 117.

As illustrated in line 8B, in the region where the silicon nitride layer 151 is formed on the diffraction grating layer 117, a wavelength shift amount was 10 nm, which corresponds to a band gap shift amount of 11 meV. On the other hand, as illustrated in line 8C, in the region where the silicon oxide layer 152 is formed on the diffraction grating layer 117, the wavelength shift amount was 60 nm, which corresponds to the band gap shift amount of 72 meV.

Therefore, by performing the fast heating process, the band gap in the quantum well active layer 113 in the region where the silicon oxide layer 152 is formed on the diffraction grating layer 117 may become greater (wider) than the band gap in the quantum well active layer 113 in the region where the silicon nitride layer 151 is formed.

Therefore, as illustrated in FIG. 7, the band gap in the quantum well active layer 113 in the regions 113a near the end surfaces of the DFB laser may become greater (wider) than the band gap in the quantum well active layer 113 in the inner region 113b.

In this embodiment, the optical semiconductor device is formed in a manner such that the thickness from the surface of the semiconductor substrate 110 to the boundary of the quantum well active layer 113 (i.e., the sum of the thicknesses of the buffer layer 111 and the first cladding layer 112) is approximately 4.3 μm. By doing this, it may become possible to control (lower) the band gap amount in the region where the silicon nitride layer 151 is formed.

The inventors of the present invention have found that the band gap amount and the variation thereof in the region where the silicon nitride layer 151 is formed is highly dependent upon the thickness of the semiconductor layers formed on the semiconductor substrate 110 side.

The band gap shift in the quantum well active layer 113 may be generated when the holes, which are generated based on the defects and impurities unevenly distributed on the semiconductor substrate 110 when a heating process is performed, arrive in the quantum well active layer 113.

The defects and impurities in the semiconductor layers may greatly vary depending on, for example, the grade of semiconductor substrate 110, processing method, processing conditions, and environments. Therefore, there are many factors that may affect the defects and impurities in the semiconductor layers, and accordingly, may generate unintended band gap shift amount and cause the variance of the band gap shift amount.

As a result of diligent studies, the inventors of the present invention have found that such unintended band gap shift amount and the variance of the band gap shift amount may be reduced by increasing the thicknesses of the buffer layer 111, the first cladding layer 112 and the like.

Figure 9:
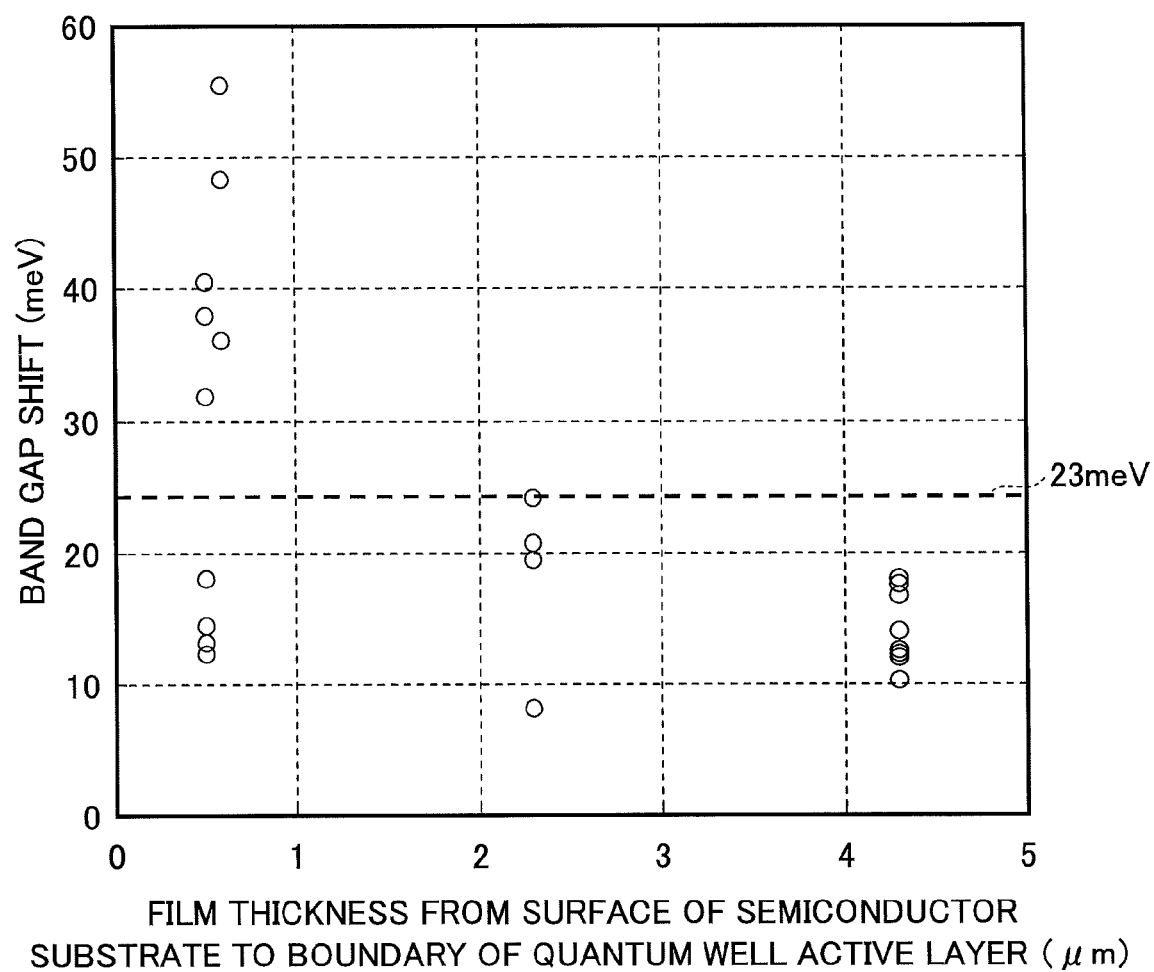
FIG. 9 is a correlation diagram between a thickness from a surface of a semiconductor substrate to a boundary of a quantum well active layer and band gap shift in the quantum well active layer.

FIG. 9 illustrates a relationship between the thickness from the surface of semiconductor substrate 110 to the boundary of the quantum well active layer 113 and the band gap shift amount in the quantum well active layer 113 in the PL intensity for 1,060 nm wavelength band, which corresponds to the band gap of 1.17 eV.

Further, the structure of the formed semiconductor layers is the same as that is illustrated in FIG. 4 and the like, and it is assumed that the silicon nitride layer 151 is formed on the diffraction grating layer 117.

As illustrated in FIG. 9, by increasing the thickness between the surface of the semiconductor substrate 110 and the boundary of the quantum well active layer 113, it may become possible to reduce the absolute value and the variation of the band gap shift amount in the quantum well active layer 113.

Further, in terms of the quality and reliability of the active layer, it is preferable that the absolute value of the band gap shift amount is less than or equal to approximately 20 nm (equivalent to 23 meV).

Further, it may be desired that the detuning accuracy converted into the wavelength is approximately 20 nm (equivalent to 23 meV) at minimum. Therefore, according to the relationship in FIG. 9, it is desired that the thickness from the surface of the semiconductor substrate 110 to the boundary of the quantum well active layer 113 is greater than or equal to 2.3 μm.

As described above, after the fast heating process is performed, the silicon oxide layer 152 and the silicon nitride layer 151 are removed, and the diffraction gratings 117a are formed on the surface of the diffraction grating layer 117.

Specifically, the silicon oxide layer 152 is removed with a buffered hydrofluoric solution, and the silicon nitride layer 151 is removed with hydrofluoric acid.

After that, a silicon oxide film is formed on the diffraction grating layer 117 again by the P-CVD, and a photoresist is applied onto the formed silicon oxide film. Then, an exposure process is performed by an exposure device, and a development process is performed.

By doing this, a resist pattern, which corresponds to the cyclic pattern of the diffraction gratings 117a to be formed on the diffraction grating layer 117, is formed on the silicon oxide film.

After that, the silicon oxide film in the region where the resist pattern is not formed is removed with a buffered hydrofluoric solution by wet etching using the formed resist pattern as a mask, to form a pattern made of silicon oxide. Then, the diffraction gratings 117a are formed on the surface of the diffraction grating layer 117 by removing the resist pattern and removing the diffraction grating layer 117 in the region where there is no silicon oxide pattern by wet etching using the silicon oxide pattern as a mask.

As etching liquid to be used herein, for example, ammonia water, hydrogen peroxide water, water mixed solution or the like may be used. The depth of the diffraction gratings 117a formed on the surface of the diffraction grating layer 117 as described above is, for example, approximately 15 nm.

Here, the cycle of the diffraction gratings 117a formed on the surface of the diffraction grating layer 117 may vary depending on the waveband (wavelength range) of the DFB laser or the like to be manufactured.

For example, in a case of the DFB laser having 1060 nm waveband, the diffraction gratings 117a is formed in a manner that the cycle of the diffraction gratings 117a is 155.6 nm. By doing this, the Bragg wavelength approximately 1060 nm may be obtained.

Figure 10A:
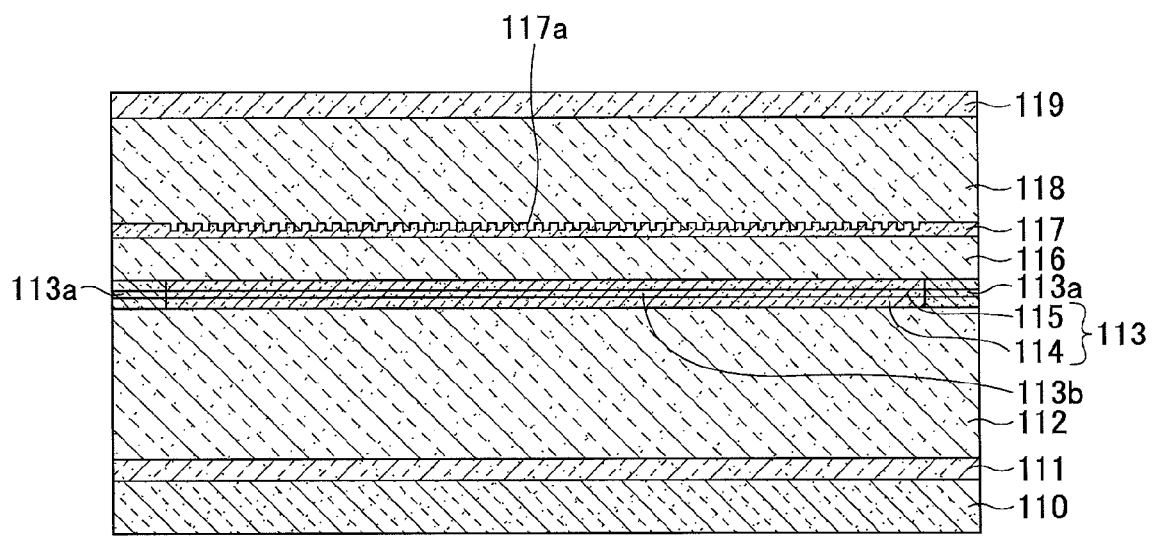
FIGS. 10A and 10B are fifth cut-away side views when the optical semiconductor device according to the first embodiment is manufactured.
Figure 10B:
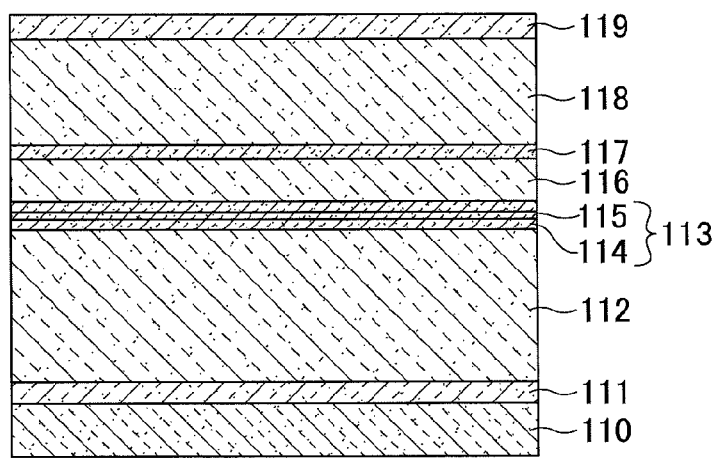

Next, as illustrated in FIGS. 10A and 10B, the third cladding layer 118 and the contact layer 119 are formed on the diffraction gratings 117a that are formed on the surface of the diffraction grating layer 117 by epitaxial growth using Metal-Organic Chemical Vapor Deposition (MOCVD).

The third cladding layer 118 is formed of a p-InGaP layer having a thickness of approximately 1,000 nm. Further, as an impurity element, Zn is doped with approximately $2 \times 10^{+18}$ cm$^{-3}$.

The contact layer 119 is formed of a p-GaAs layer having a thickness of approximately 300 nm. Further, as an impurity element, Zn is doped with approximately $2 \times 10^{+19}$ cm$^{-3}$.

Further, FIGS. 10A and 10B are cut-away side views schematically illustrating this process. Specifically, FIG. 10A is a cut-away side view when cut along the dashed-dotted line 1A-1B of FIG. 1, and FIG. 10B is a cut-away side view when cut along the dashed-dotted line 1C-1D of FIG. 1.

Figure 11A:
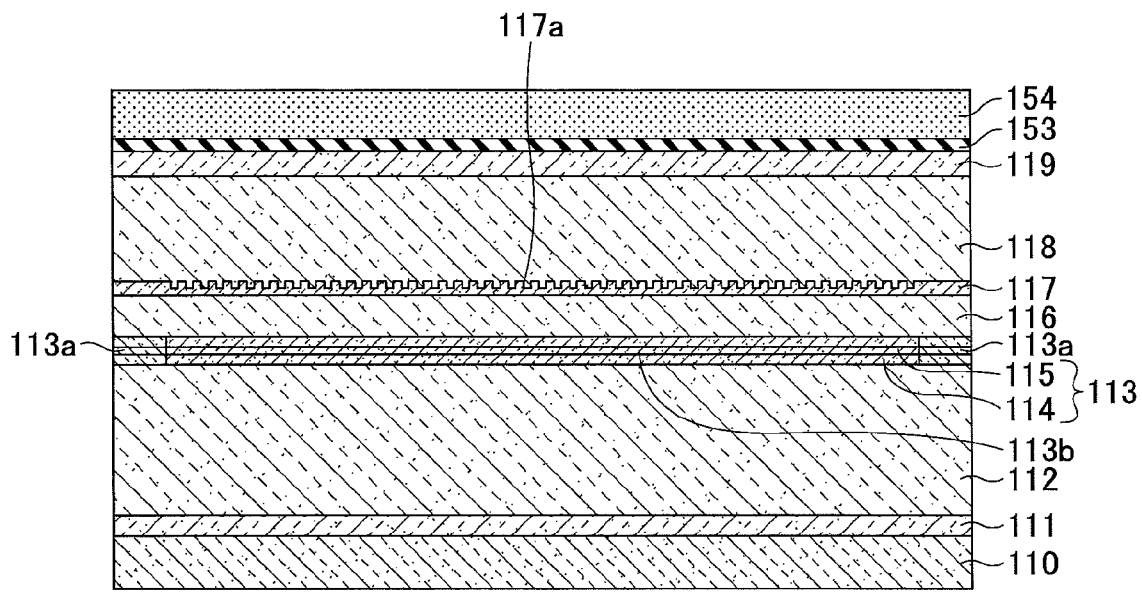
FIGS. 11A and 11B are sixth cut-away side views when the optical semiconductor device according to the first embodiment is manufactured.
Figure 11B:
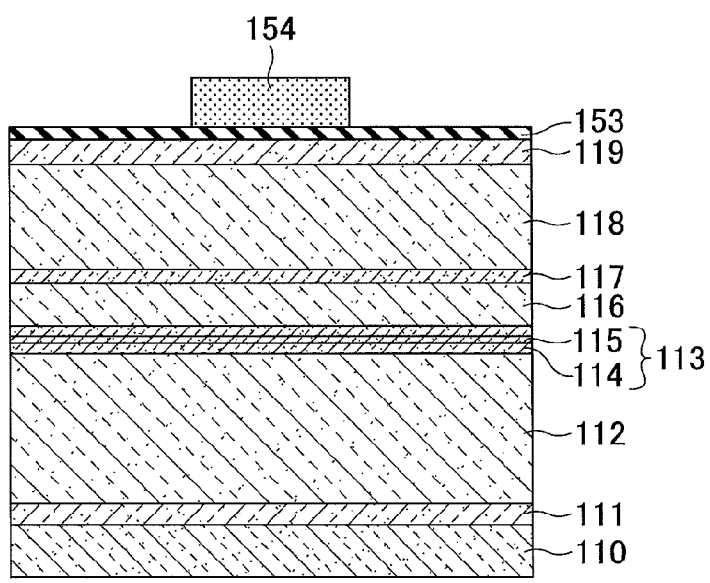

Next, as illustrated in FIGS. 11A and 11B, a silicon oxide film 153 is formed on the contact layer 119, and a resist pattern 154, which is used for forming the ridge waveguide 140 on the formed silicon oxide film 153, is formed.

Specifically, the silicon oxide film 153 is formed on the contact layer 119 by the P-CVD, and a photoresist is applied onto the formed silicon oxide film 153.

Then, an exposure process is performed by an exposure device, and a development process is performed to form the resist pattern 154. The resist pattern 154 formed as described above is formed on the region where the ridge waveguide 140 is to be formed.

Further, FIGS. 11A and 11B are cut-away side views schematically illustrating this process. Specifically, FIG. 11A is a cut-away side view when cut along the dashed-dotted line 1A-1B of FIG. 1, and FIG. 11B is a cut-away side view when cut along the dashed-dotted line 1C-1D of FIG. 1.

Figure 12A:
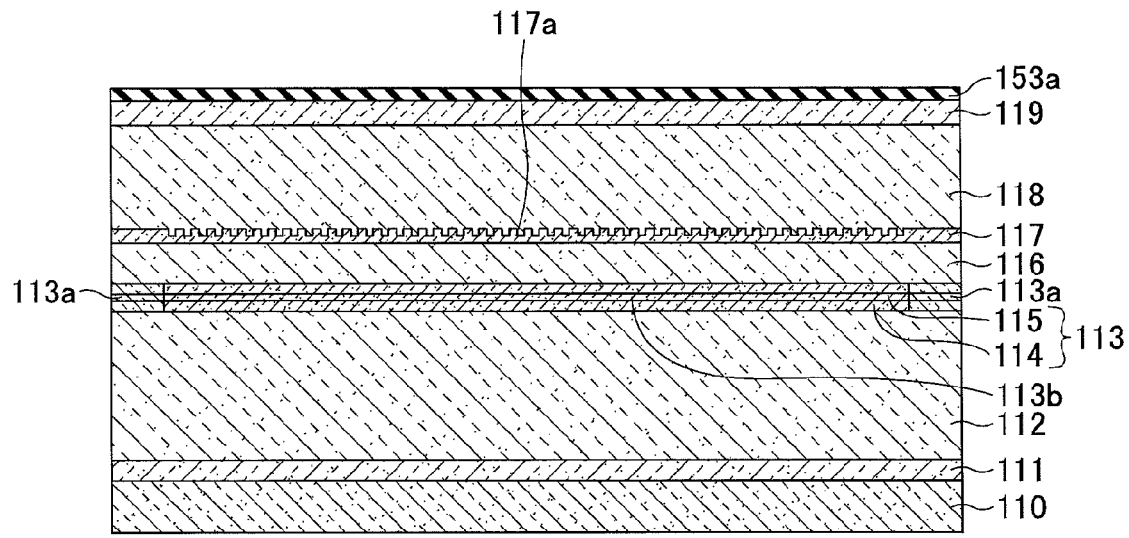
FIGS. 12A and 12B are seventh cut-away side views when the optical semiconductor device according to the first embodiment is manufactured.
Figure 12B:
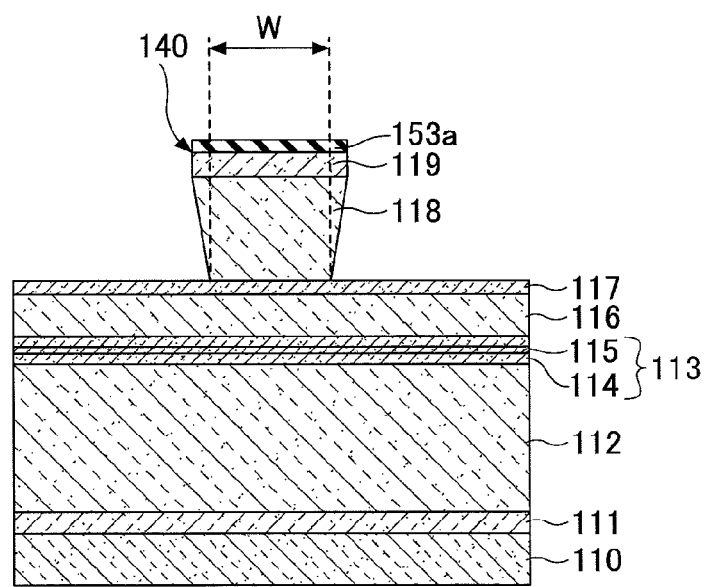

Next, as illustrated in FIGS. 12A and 12B, the silicon oxide film 153 in the region where the resist pattern 154 is not formed is removed by wet etching using a buffered hydrofluoric solution to form a silicon oxide mask 153a. After that, the contact layer 119 and the third cladding layer 118, which are formed in the region where the silicon oxide mask 153a is not formed, is removed by wet etching to form the ridge waveguide 140.

As etching liquid to remove the contact layer 119, for example, ammonia water, hydrogen peroxide water, water mixed solution or the like may be used. As etching liquid to remove the third cladding layer 118, for example, a mixed solution of hydrochloric acid and acetic acid may be used.

Further, p-GaAs may not be etched with the mixed solution of hydrochloric acid and acetic acid. Therefore, the etching of the third cladding layer 118 may be stopped where the surface of the diffraction grating layer 117 formed of p-GaAs is exposed.

By doing this, in the region where the silicon oxide mask 153a is formed, the ridge waveguide 140 is formed based on the third cladding layer 118 and the contact layer 119 which remain after etching. In this embodiment, the ridge waveguide 140 is formed in a manner such that the ridge width "W" of the ridge waveguide 140 is approximately 2.0 µm.

If the ridge width "W" of the ridge waveguide 140 is substantially equal to 2.0 µm, it may become possible to reduce (control) the excitation (oscillation) in the high-order transverse mode and substantially transmit only the fundamental transverse mode as the waveguide more.

Further, FIGS. 12A and 12B are cut-away side views schematically illustrating this process. Specifically, FIG. 12A is a cut-away side view when cut along the dashed-dotted line 1A-1B of FIG. 1, and FIG. 12B is a cut-away side view when cut along the dashed-dotted line 1C-1D of FIG. 1.

Figure 13A:
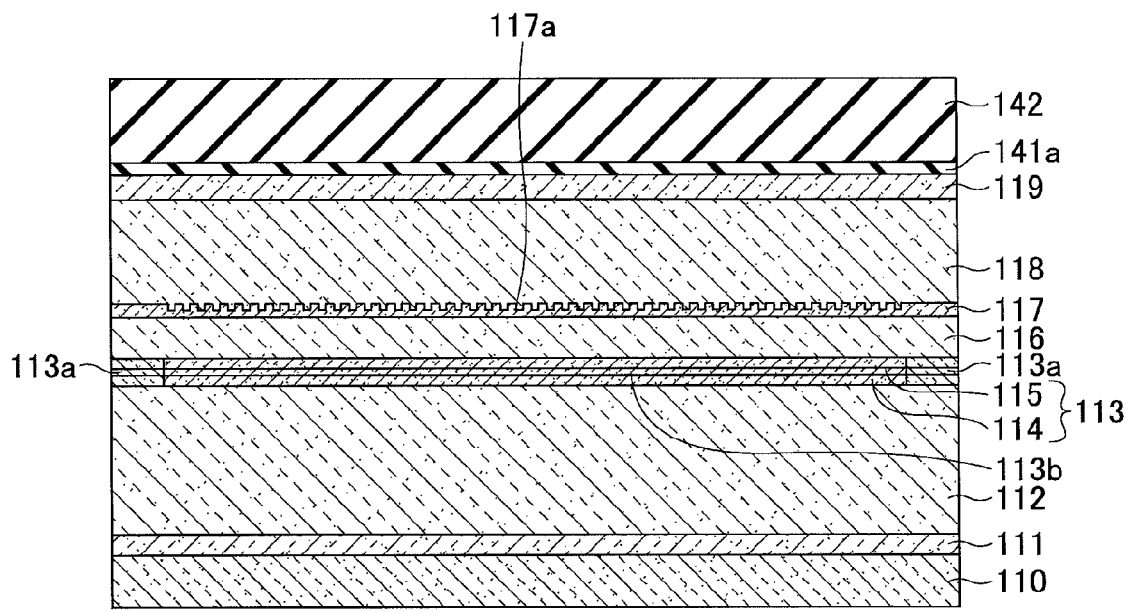
FIGS. 13A and 13B are eighth cut-away side views when the optical semiconductor device according to the first embodiment is manufactured.
Figure 13B:
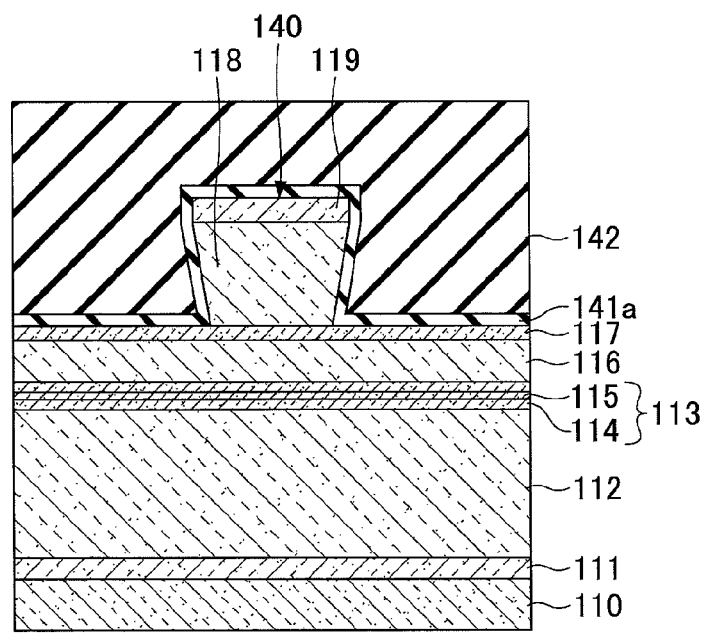

Next, as illustrated in FIGS. 13A and 13B, after the silicon oxide mask 153a is removed, a silicon oxide film 141a is formed in a manner that the silicon oxide film 141a covers (surrounds) the ridge waveguide 140 and the buried layer 142 is formed by burying an organic insulation material in the removed region which is removed by etching as described above. The silicon oxide film 141a is formed by CVD in a manner that the silicon oxide film 141a covers the entire ridge waveguide 140.

After that, an organic insulation material such as Benzocyclobutene (BCB) is applied (spin coated) onto the surface where the silicon oxide film 141a is formed to fill the region, where the portion of the layer or the like has been removed by the etching, to form the ridge waveguide 140. After that, the buried layer 142 is formed by performing a heating process of heating at approximately 300° C. (degrees) for sintering.

Further, FIGS. 13A and 13B are cut-away side views schematically illustrating this process. Specifically, FIG. 13A is a cut-away side view when cut along the dashed-dotted line 1A-1B of FIG. 1, and FIG. 13B is a cut-away side view when cut along the dashed-dotted line 1C-1D of FIG. 1.

Figure 14A:
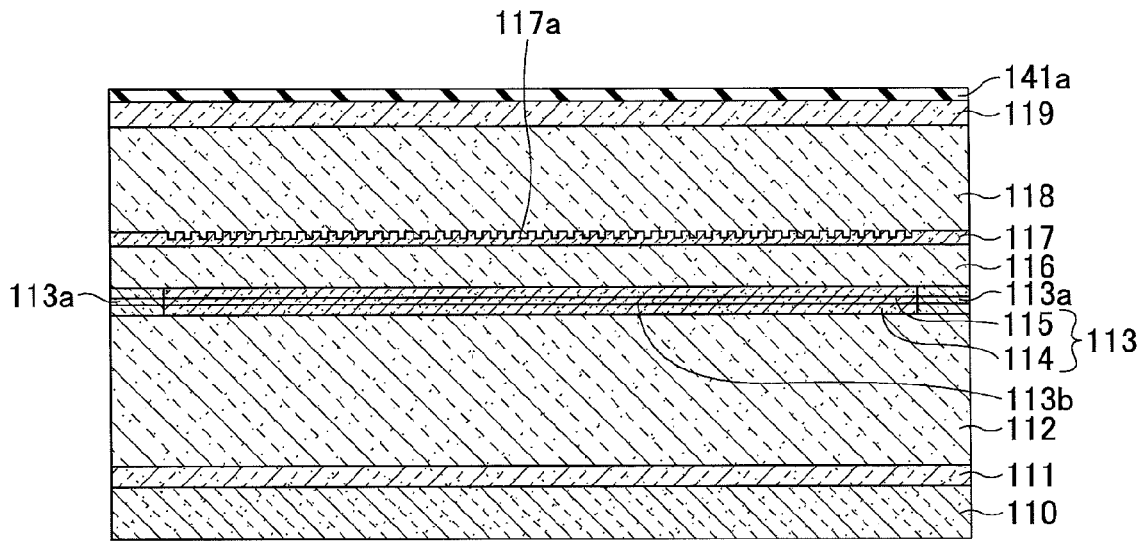
FIGS. 14A and 14B are ninth cut-away side views when the optical semiconductor device according to the first embodiment is manufactured.
Figure 14B:
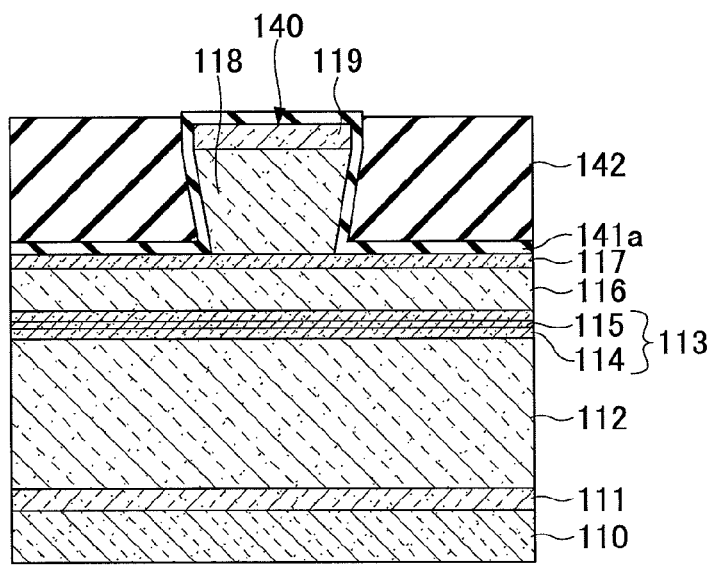

Next, as illustrated in FIGS. 14A and 14B, the buried layer 142 is etched back from the surface thereof to expose the silicon oxide film 141a on the region where the ridge waveguide 140 is formed. Specifically, the buried layer 142 is etched back by, for example, Reactive Ion Etching (RIE).

Further, FIGS. 14A and 14B are cut-away side views schematically illustrating this process. Specifically, FIG. 14A is a cut-away side view when cut along the dashed-dotted line 1A-1B of FIG. 1, and FIG. 14B is a cut-away side view when cut along the dashed-dotted line 1C-1D of FIG. 1.

Figure 15A:
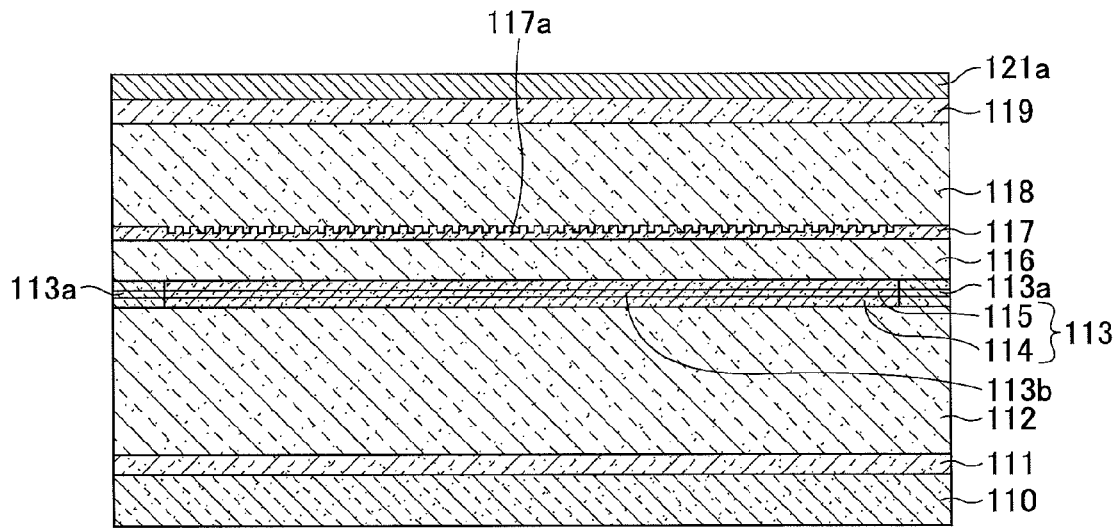
FIGS. 15A and 15B are tenth cut-away side views when the optical semiconductor device according to the first embodiment is manufactured.
Figure 15B:
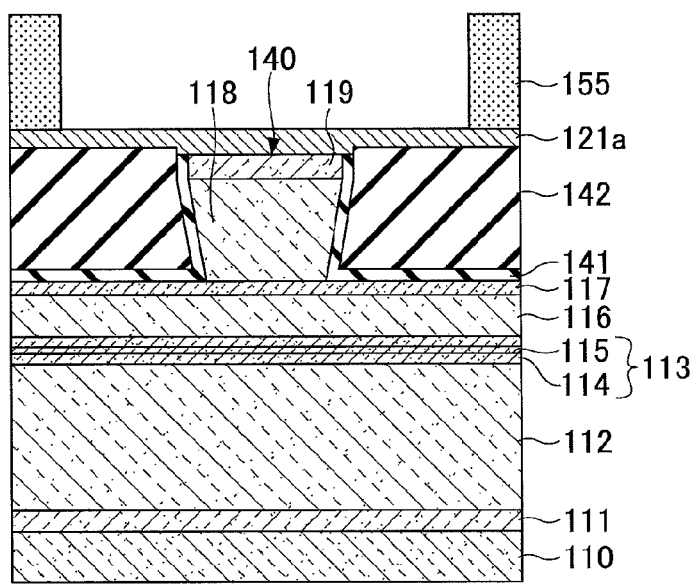

Next, as illustrated in FIGS. 15A and 15B, the exposed silicon oxide film 141a is removed, and the metal film 121a is formed on the region including the contact layer 119 which is exposed due to the removal of the silicon oxide film 141a. Specifically, the exposed silicon oxide film 141a is removed with a buffered hydrofluoric solution or the like, so that the contact layer 119 in the ridge waveguide 140 is exposed.

Here, by removing the exposed silicon oxide film 141a as described above, due to the remaining silicon oxide film 141a, the protection film 141 may be formed on a side surface or the like of the ridge waveguide 140. After that, the metal film 121a is formed by forming a Ti/Pt/Au film by electron beam evaporation on the surface where the contact layer 119 is exposed.

After that, on the metal film 121a, a resist pattern 155 is formed which has an opening corresponding to a region where the upper electrode 121 is to be formed. Specifically, a photoresist is applied onto the metal film 121a. Then, an exposure process is performed by an exposure device, and a development process is performed to form the resist pattern 155.

Further, FIGS. 15A and 15B are cut-away side views schematically illustrating this process. Specifically, FIG. 15A is a cut-away side view when cut along the dashed-dotted line 1A-1B of FIG. 1, and FIG. 15B is a cut-away side view when cut along the dashed-dotted line 1C-1D of FIG. 1.

Figure 16A:
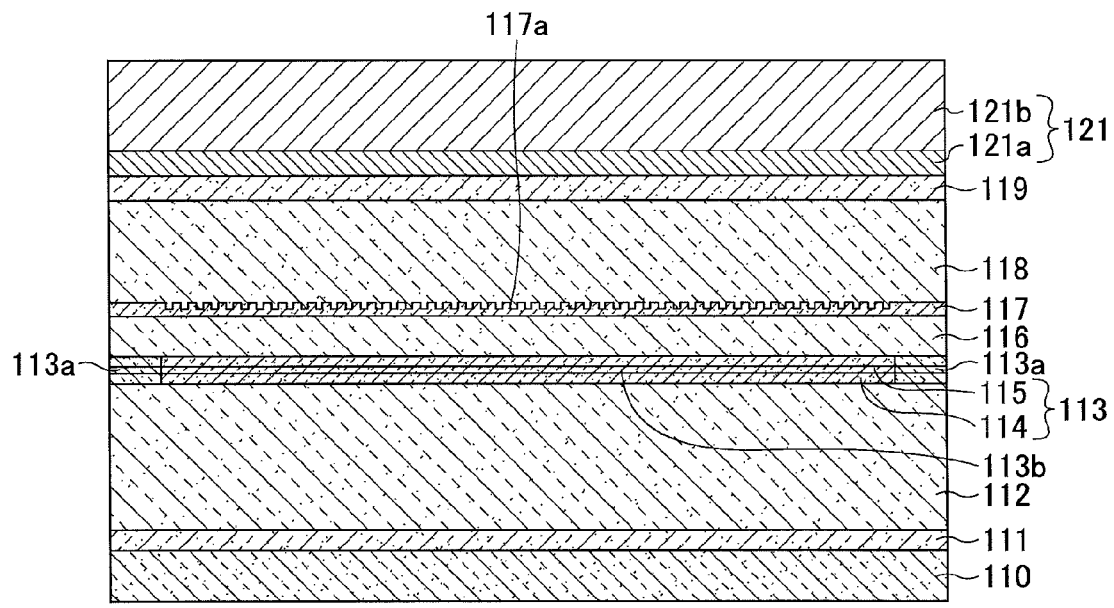
FIGS. 16A and 16B are eleventh cut-away side views when the optical semiconductor device according to the first embodiment is manufactured.
Figure 16B:
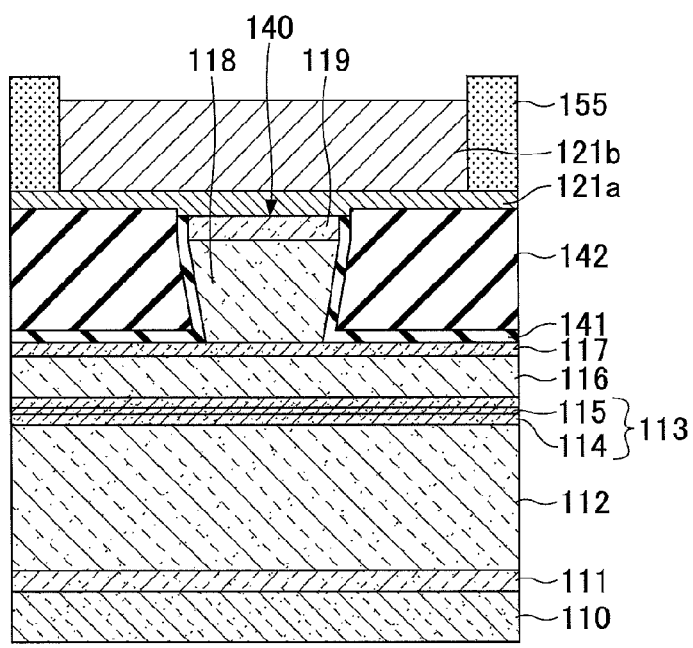

Next, as illustrated in FIGS. 16A and 16B, by performing Au coating using the metal film 121a as an electrode, the coating film 121b is formed on the metal film 121a in the region where the resist pattern 155 is not formed.

Further, FIGS. 16A and 16B are cut-away side views schematically illustrating this process. Specifically, FIG. 16A is a cut-away side view when cut along the dashed-dotted line 1A-1B of FIG. 1, and FIG. 16B is a cut-away side view when cut along the dashed-dotted line 1C-1D of FIG. 1.

Figure 17A:
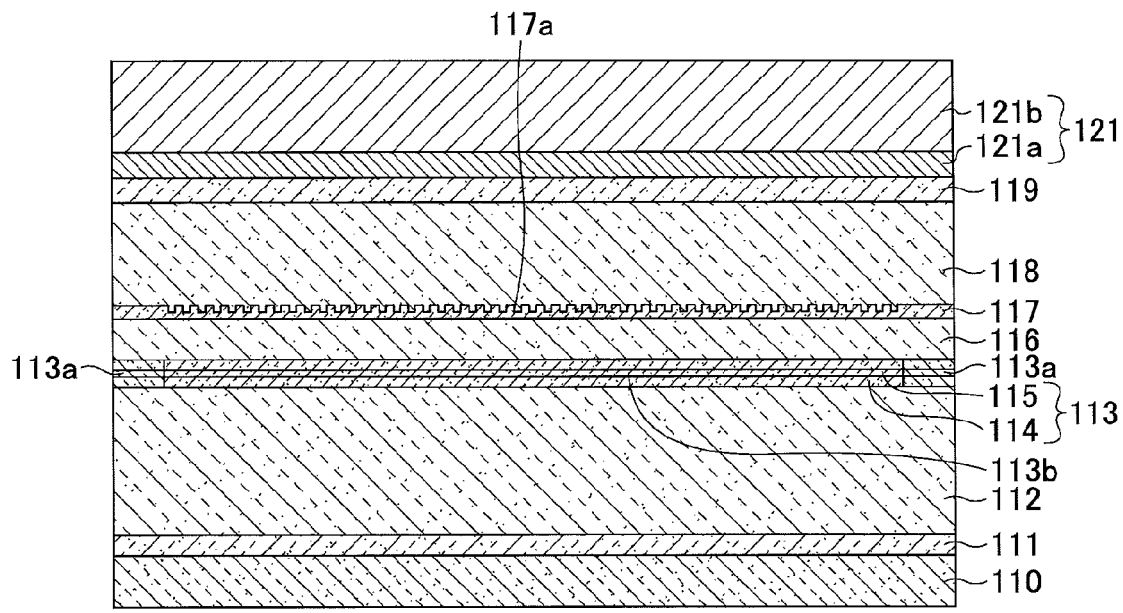
FIGS. 17A and 17B are twelfth cut-away side views when the optical semiconductor device according to the first embodiment is manufactured.
Figure 17B:
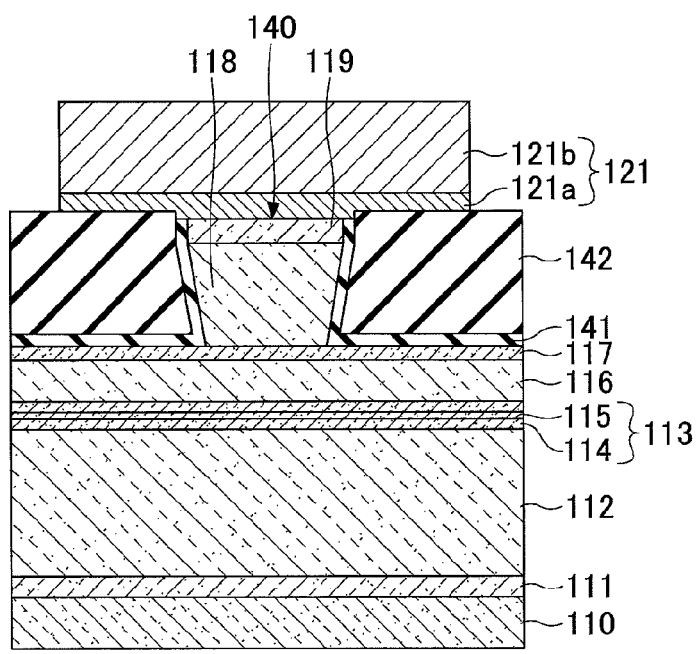

Next, as illustrated in FIGS. 17A and 17B, the resist pattern 155 is removed to expose the metal film 121a. After that, by performing a dry etching such as the RIE on the entire surface, the exposed metal film 121a is removed. In this case, a part of the surface of the coating film 121b may also be removed.

However, the coating film 121b is formed so as to have a sufficient thickness. Therefore, the removed amount (thickness) of the coating film 121b may be very small (limited) when compared with the entire amount (thickness) of the coating film 121b. By doing this, the upper electrode 121 is formed based on the remaining metal film 121a and coating film 121b.

Further, FIGS. 17A and 17B are cut-away side views schematically illustrating this process. Specifically, FIG. 17A is a cut-away side view when cut along the dashed-dotted line 1A-1B of FIG. 1, and FIG. 17B is a cut-away side view when cut along the dashed-dotted line 1C-1D of FIG. 1.

Figure 18A:
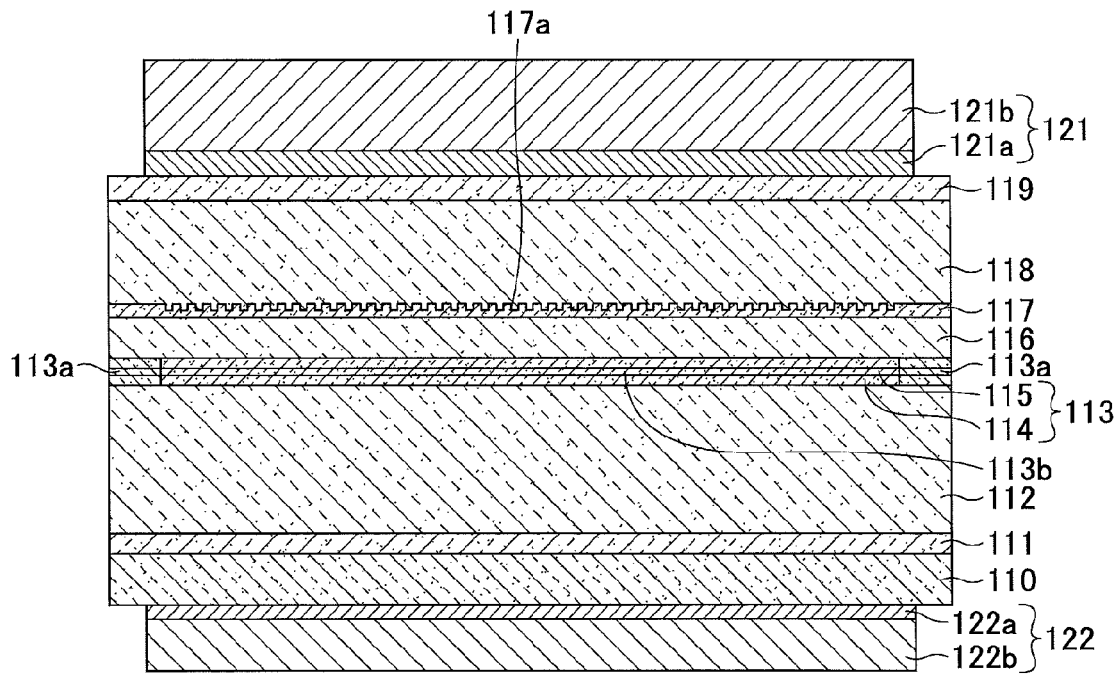
FIGS. 18A and 18B are thirteenth cut-away side views when the optical semiconductor device according to the first embodiment is manufactured.
Figure 18B:
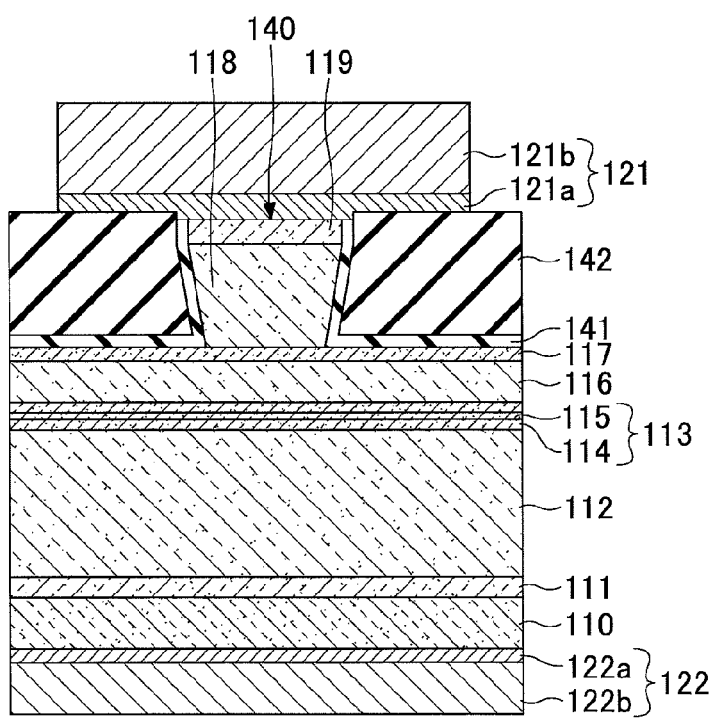

Next, as illustrated in FIGS. 18A and 18B, the rear surface of the semiconductor substrate 110 is polished until the thickness is approximately 150 μm. Then, a metal film 122a is formed on the rear surface of the semiconductor substrate 110 by accumulating AuGe/Au by vacuum vapor deposition.

After that, the coating layer 122b is formed by performing Au coating using the metal film 122a as an electrode. By doing this, the lower electrode 122 is formed based on the metal film 122a and the coating layer 122b which are formed as described above.

Further, FIGS. 18A and 18B are cut-away side views schematically illustrating this process. Specifically, FIG. 18A is a cut-away side view when cut along the dashed-dotted line 1A-1B of FIG. 1, and FIG. 18B is a cut-away side view when cut along the dashed-dotted line 1C-1D of FIG. 1.

Figure 19A:
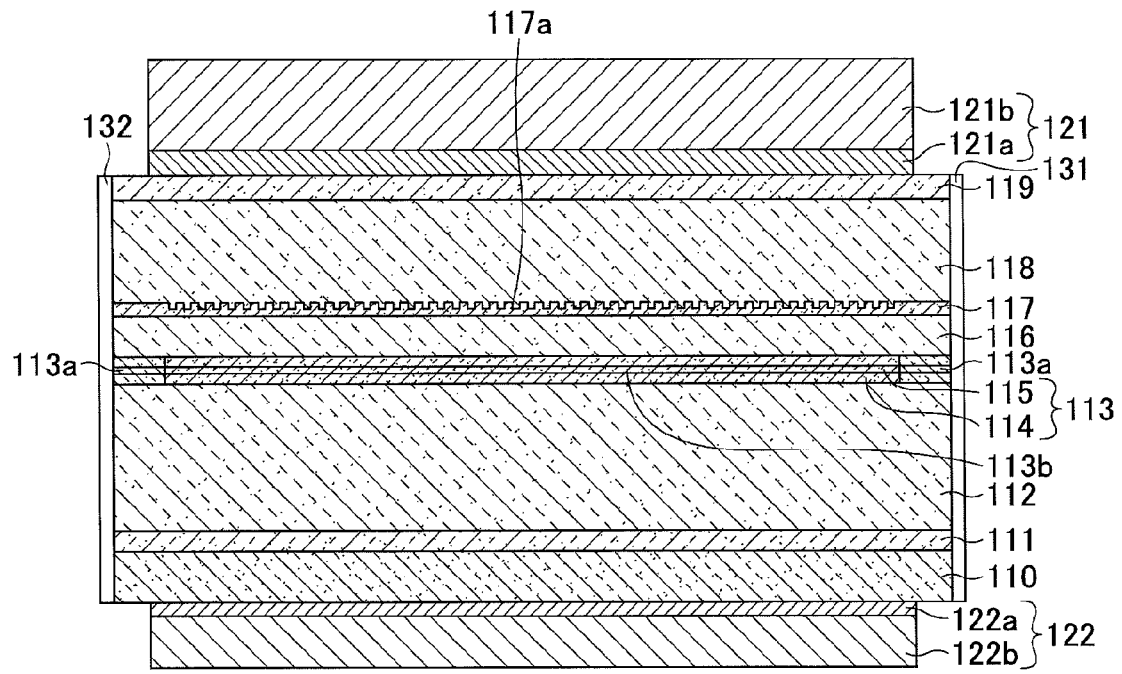
FIGS. 19A and 19B are fourteenth cut-away side views when the optical semiconductor device according to the first embodiment is manufactured.
Figure 19B:
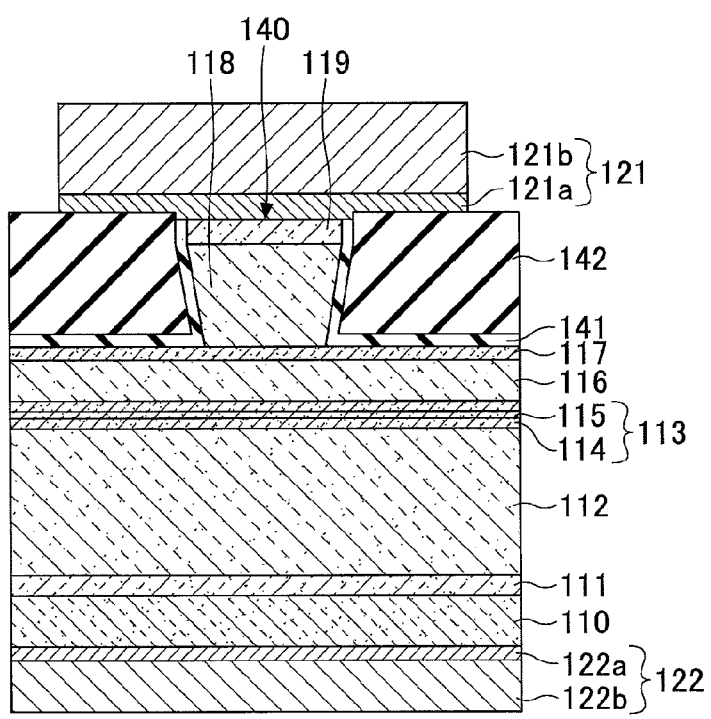

Next, as illustrated in FIGS. 19A and 19B, after cutting, the anti-reflection film 131 is formed on an end surface on one side of the DFB laser, and the high-reflection film 132 is formed on an end surface on the other side of the DFB laser.

Further, as described above, the regions 113a are formed in the quantum well active layer 113 and near the respective end surfaces where the anti-reflection film 131 and the high-reflection film 132 of the DFB laser are formed.

Further, in this embodiment, for example, the anti-reflection film 131 is formed in a manner that the reflectance thereof is approximately less than or equal to 1%, and the high-reflection film 132 is formed in a manner that the reflectance thereof is approximately 95%.

Further, FIGS. 19A and 19B are cut-away side views schematically illustrating this process. Specifically, FIG. 19A is a cut-away side view when cut along the dashed-dotted line 1A-1B of FIG. 1, and FIG. 19B is a cut-away side view when cut along the dashed-dotted line 1C-1D of FIG. 1.

By doing as described above, a DFB laser according to this embodiment may be formed (manufactured). In the DFB laser formed as described above, laser light is emitted from the end surface where the anti-reflection film 131 is formed.

In this embodiment, the band gap of the quantum well active layer 113 in the regions 113a near the end surfaces of the DFB laser may become greater (wider) than that in the quantum well active layer 113 in the inner region 113b.

Accordingly, it may become possible to control (reduce) the COD even when the DFB laser is used with high power. Further, the band gap shift amount and the variance of the band gap shift amount in the quantum well active layer 113 in the inner region 113b may be reduced. Therefore, it may become possible to prevent yield rate reduction.

Further, in this embodiment, a case is described where the silicon nitride layer 151 and the silicon oxide layer 152 are used (formed) when the optical semiconductor device is manufactured. However, the present invention is not limited to this case (configuration).

Namely, any other configuration which may produce the same effect may be used. Further, the heat processing time period and the heating temperature which are described above as the parameters in the fast heating process are examples only. Namely, any other appropriate time period and temperature may be determined and used based on, for example, the device and any other conditions.

Further, in the above description according to this embodiment, a DFB laser is described as an optical semiconductor device. However, the present invention may also be applied to, for example, a single-mode laser, such as a DBR laser and Super Structure Grating (SSG)-DBR laser, including diffraction gratings.

Further, in the above description, a case is described where the quantum well active layer 113 includes two quantum well layers 115. However, the quantum well active layer 113 may include three or more quantum well layers 115.

Further, as long as the sum of the thicknesses of the buffer layer 111 and the first cladding layer 112 is greater than or equal to 2.3 μm, the sum of the thicknesses of the buffer layer 111 and the first cladding layer 112 may be any value greater than or equal to 2.3 μm.

Further, the semiconductor substrate 110 is not limited to the n-GaAs substrate. Namely, for example, the semiconductor substrate 110 may be p-GaAs substrate, or any substrate other than a GaAs substrate such as an InP substrate.

Further, when, for example, the ridge waveguide 140 and the diffraction gratings 117a are formed, dry etching instead of wet etching may be used.

Further, in the above description, a case is described where the diffraction gratings 117a are uniformly formed and the anti-reflection film 131 and the high-reflection film 132 are formed on the respective end surfaces of the DFB laser. However, for example, λ/4-shifted diffraction gratings may be used or the anti-reflection films may be formed on both end surfaces of the DFB laser.

Further, the phase shift is not limited to "λ/4". The position where such phase shift is formed may be formed at a position separated from the center.

Further, a case is described where the region 113a is formed near the both end surfaces of the DFB laser. However, the region 113a is formed near one of the end surfaces of the DFB laser only.

Second Embodiment

Figure 20:
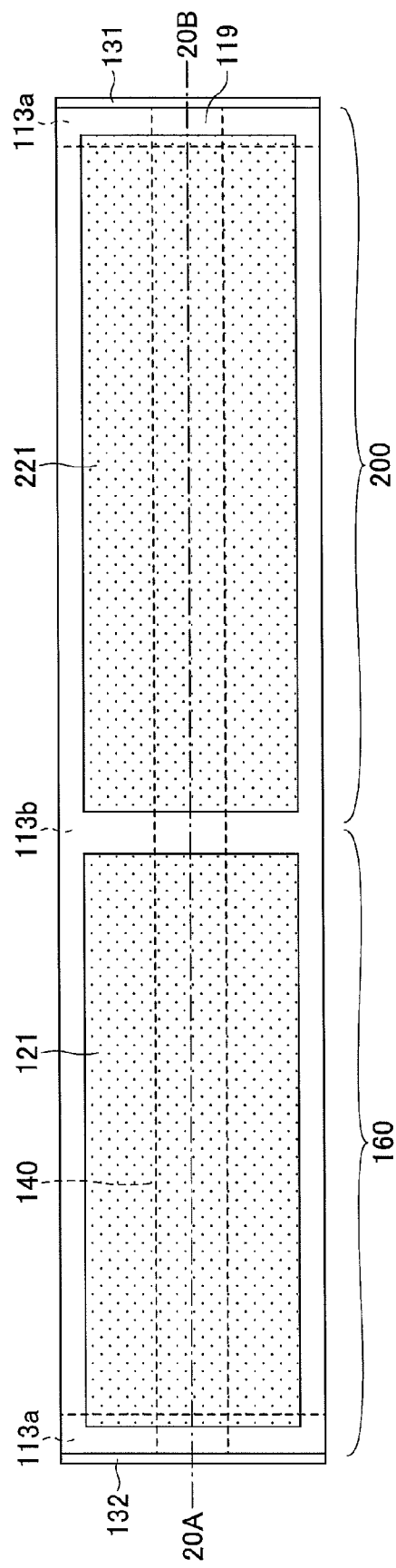
FIG. 20 is a top view of an optical semiconductor device according to a second embodiment.

Next, a second embodiment of the present invention is described. As schematically illustrated in FIGS. 20 and 21, an optical semiconductor device according to this embodiment includes a Semiconductor Optical Amplifier (SOA). Here, FIG. 20 is a top view of the optical semiconductor device, and FIG. 21 is a cut-away side view when cut along the dashed-dotted line 20A-20B of FIG. 20.

The optical semiconductor device according to this embodiment includes a DFB laser region 160 where the DFB laser according to the first embodiment described above and a Semiconductor Optical Amplifier region (SOA region) 200 where a semiconductor film similar to that of the DFB laser is formed.

In this embodiment, gain characteristics in the SOA region 200 may also vary due to detuning. Therefore, it may become possible to reduce (control) an unintended band gap shift amount and a variance of the band gap shift amount may be reduced.

In this embodiment, the SOA region 200 has the same configuration as that of the DFB laser region 160 except that there are no diffraction gratings 117a formed on the diffraction grating layer 117 and there is an SOA upper electrode 221 formed as the upper electrode in the SOA region 200.

Further, the SOA upper electrode 221 is formed of a metal film 221a and a coating film 221b whose structure is the same as that of the upper electrode 121 of the in the DFB laser region 160. Therefore, the SOA upper electrode 221 may be formed in the same method of forming the upper electrode 121 of the in the DFB laser region 160 at the same time.

Therefore, the optical semiconductor device according to this embodiment may be formed (manufactured) based on the same steps as those in the forming (manufacturing) the optical semiconductor device according to the first embodiment.

Further, FIGS. 20 and 21 illustrate a case where the DFB laser region 160 and the SOA region 200 are formed adjacent (next) to each other. However, for example, to improve electrical and thermal isolation between the DFB laser region 160 and the SOA region 200, the DFB laser region 160 and the SOA region 200 may be formed so as to be separated from each other.

Except the configurations (features) describes above, the configuration in the second embodiment is the same as that in the first embodiment.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiments of the present inventions have been described in detail, it is to be understood that various changes, substitutions, and alterations could be made hereto without departing from the spirit and scope of the invention.

What is claimed is:

1. An optical semiconductor device comprising:
   a semiconductor substrate;
   a lower cladding layer formed over the semiconductor substrate and formed of a semiconductor material;
   a quantum well active layer formed on the lower cladding layer and formed of a semiconductor material;
   a diffraction grating layer formed over the quantum well active layer and formed of a semiconductor material, the diffraction grating layer having diffraction gratings formed on a surface thereof;
   an upper cladding layer formed on the diffraction gratings of the diffraction grating layer; and
   a ridge waveguide, formed over the diffraction gratings, and extending in a longitudinal direction thereof between a first outer end surface of the optical semiconductor device and a second outer end surface of the optical semiconductor device opposite to the first outer end surface, wherein the longitudinal direction of the ridge waveguide is non-parallel to each of the first and second outer end surfaces,
   wherein a band gap in outer regions of the quantum well active layer that are adjacent to the first and second outer end surfaces of the optical semiconductor device is wider than a band gap in an inner region of the quantum well active layer that is located between the outer regions, wherein each of the outer regions and the inner region of the quantum well active layer extends in a direction parallel to the first and second outer end surfaces,
   wherein a thickness of one or more layers, which include the lower cladding layer and are arranged between the semiconductor substrate and the quantum well active layer, is greater than or equal to 2.3 µm, and
   wherein the diffraction gratings are formed on the surface of the diffraction grating layer in a first region of the diffraction grating layer corresponding to the inner region of the quantum well active layer and excluding second regions of the diffraction grating layer corresponding to the outer regions of the quantum well active layer, so that the ridge waveguide extends in the longitudinal direction thereof over the first and second regions of the diffraction grating layer.

2. The optical semiconductor device according to claim 1, wherein the surface of the diffraction grating layer includes a laser region where the diffraction gratings are formed and a semiconductor optical amplifier region where the diffraction gratings are not formed.

3. The optical semiconductor device according to claim 1, further comprising:
   a second cladding layer formed between the quantum well active layer and the diffraction grating layer,
   wherein the lower cladding layer forms a first cladding layer and the upper cladding layer forms a third cladding layer.

4. The optical semiconductor device according to claim 3, further comprising:
   a contact layer formed on the third cladding layer and formed of a semiconductor material;
   an upper electrode formed on the contact layer; and
   a lower electrode formed on a rear surface of the semiconductor substrate,
   wherein the second and third cladding layers are formed of respective semiconductor materials.

5. The optical semiconductor device according to claim 4, wherein the ridge waveguide is formed by a part of the third cladding layer and the contact layer, and extends in the longitudinal direction thereof from the first outer end surface of the optical semiconductor device to the second outer end surface of the optical semiconductor device.

6. The optical semiconductor device according to claim 3, wherein the second cladding layer is formed of a material including AlGaAs.

7. The optical semiconductor device according to claim 1, wherein the quantum well active layer includes one or more barrier layers and one or more quantum well layers that are laminated alternately, the barrier layers are formed of a material including GaAs, and the quantum well layers are formed of a material including InGaAs.

8. The optical semiconductor device according to claim 1, wherein the semiconductor substrate is a GaAs substrate or an InP substrate.

9. The optical semiconductor device according to claim 1, further comprising:
a buffer layer formed between the semiconductor substrate and the lower cladding layer and formed of a semiconductor material.

10. The optical semiconductor device according to claim 9, wherein the buffer layer is formed of a material including GaAs.

11. The optical semiconductor device according to claim 1, wherein the lower cladding layer is formed of a material including AlGaAs.

12. The optical semiconductor device according to claim 1, wherein the diffraction grating layer is formed of a material including GaAs.

13. The optical semiconductor device according to claim 1, wherein the upper cladding layer is formed of a material including InGaP.

14. The optical semiconductor device according to claim 1, further comprising:
an anti-reflection film formed on at least one of the first and second outer end surfaces of the optical semiconductor device.

15. A method of manufacturing an optical semiconductor device, comprising:
forming a semiconductor layer by sequentially laminating a lower cladding layer, a quantum well active layer, and a diffraction grating layer, which are formed of respective semiconductor materials, on a semiconductor substrate;
forming a first dielectric layer in a first region of the diffraction grating layer, the first region being located between second regions of the diffraction grating layer that are adjacent to mutually opposite first and second end surfaces of the semiconductor layer;
forming a second dielectric layer on the first dielectric layer and in the second regions of the diffraction grating layer;
heating the semiconductor layer after the second dielectric layer is formed, so that a band gap in outer regions of the quantum well active layer corresponding to the second regions becomes wider than a band gap in an inner region of the quantum well active layer corresponding to the first region, wherein each of the outer regions and the inner region of the quantum well active layer extends in a direction parallel to the first and second outer end surfaces;
removing the first and second dielectric layers after the heating;
forming diffraction gratings on a surface of the diffraction grating layer in the inner region of the diffraction grating layer and excluding the outer regions of the diffraction grating layer after the heating;
forming an upper cladding layer on the surface of the diffraction grating layer having the diffraction gratings formed thereon after the heating; and
removing a part of the upper cladding layer to form a ridge waveguide, over the diffraction gratings, and extending in a longitudinal direction thereof between the first end surface of the semiconductor layer and the second end surface of the semiconductor layer, so that the ridge waveguide extends over the inner and outer regions of the diffraction grating layer, wherein the longitudinal direction of the ridge waveguide is non-parallel to each of the first and second outer end surfaces.

16. The method according to claim 15, wherein the first dielectric layer is formed of a silicon nitride film, and the second dielectric layer is formed of a silicon oxide film.

17. The method according to claim 15, wherein a thickness of one or more layers, which include the lower cladding layer and are arranged between the semiconductor substrate and the quantum well active layer, is greater than or equal to 2.3 µm.

18. The method according to claim 15, wherein the lower cladding layer, the quantum well active layer, and the diffraction grating layer are grown epitaxially.

19. The method according to claim 15, wherein the semiconductor layer is formed by sequentially laminating the lower cladding layer, the quantum well active layer, the upper cladding layer, the diffraction grating layer, and the upper cladding layer on the semiconductor substrate.

20. The method according to claim 15, wherein the forming the semiconductor layer forms a buffer layer between the semiconductor substrate and the lower cladding layer.

21. The optical semiconductor device according to claim 1, further comprising:
an anti-reflection film formed on the first outer end surface of the optical semiconductor device; and
a high-reflection film formed on the second outer end surface of the optical semiconductor device.

22. The optical semiconductor device according to claim 1, wherein the ridge waveguide includes the upper cladding layer having a tapered cross sectional shape which decreases in area towards the diffraction grating layer.

23. The method according to claim 15, further comprising:
forming an anti-reflection film on the first end surface of the semiconductor layer; and
forming a high-reflection film on the second end surface of the semiconductor layer.

24. The method according to claim 15, further comprising:
forming a contact layer on the upper cladding layer,
wherein the removing removes a part of the upper cladding layer and the contact layer to form the ridge waveguide which extends in the longitudinal direction thereof from the first end surface of the semiconductor layer to the second end surface of the semiconductor layer, and in which the upper cladding layer has a tapered cross sectional shape which decreases in area towards the diffraction grating layer.

25. The method according to claim 15, wherein the heating the semiconductor layer diffuses holes from the second dielectric layer formed in the second regions of the diffraction grating layer to the outer regions of the quantum well active layer.

* * * * *